United States Patent
Wood et al.

(10) Patent No.: US 11,726,276 B1
(45) Date of Patent: Aug. 15, 2023

(54) MULTI-CHIP PHOTONICS TRANSCEIVER

(71) Applicants: National Technology & Engineering Solutions of Sandia, LLC, Albuquerque, NM (US); The Texas A&M University System, College Station, TX (US)

(72) Inventors: Michael Wood, Albuquerque, NM (US); Alejandro J. Grine, Albuquerque, NM (US); Darwin K. Serkland, Albuquerque, NM (US); Bryan James Kaehr, Albuquerque, NM (US); Andrew E. Hollowell, Albuquerque, NM (US); Gregory M. Peake, Albuquerque, NM (US); Alexander Ruyack, Albuquerque, NM (US); Sam Palermo, College Station, TX (US)

(73) Assignees: National Technology & Engineering Solutions of Sandia, LLC, Albuquerque, NM (US); The Texas A&M University System, College Station, TX (US)

( * ) Notice: Subject to any disclaimer, the term of this patent is extended or adjusted under 35 U.S.C. 154(b) by 79 days.

(21) Appl. No.: 17/391,167

(22) Filed: Aug. 2, 2021

Related U.S. Application Data

(60) Provisional application No. 63/061,314, filed on Aug. 5, 2020, provisional application No. 63/061,301, filed on Aug. 5, 2020.

(51) Int. Cl.
*G02B 6/42* (2006.01)
*G02B 6/43* (2006.01)
(Continued)

(52) U.S. Cl.
CPC ......... *G02B 6/4215* (2013.01); *G02B 6/2934* (2013.01); *G02B 6/4249* (2013.01);
(Continued)

(58) Field of Classification Search
None
See application file for complete search history.

(56) References Cited

U.S. PATENT DOCUMENTS

2018/0164515 A1* 6/2018 Amit ................. G02B 27/1006

FOREIGN PATENT DOCUMENTS

JP 2020027147 A * 2/2020

OTHER PUBLICATIONS

Chen et al. ("A WDM Silicon Photonic Transmitter based on Carrier-Injection Microring Modulators", IEEE, 2014 Optical Interconnects Conference, 2014) (Year: 2014).*
(Continued)

*Primary Examiner* — Michelle R Connelly
(74) *Attorney, Agent, or Firm* — Mark A. Dodd

(57) ABSTRACT

A photonics transceiver is described herein, wherein the photonics transceiver exhibits improved areal bandwidth density and improved energy per bit consumption relative to conventional photonics transceivers. The photonics transceiver achieves an areal bandwidth density of at least 5 Tbps/mm$^2$ with an energy consumption of less than 500 fJ/bit (sum of energy consumed for both a transmitted bit and a received bit). The photonics transceiver is a multi-chip module, where chips in the multi-chip module are tightly integrated with one another. The multi-chip module includes light source, photodetector, photonics, and control/logic chips. The photonics chip includes transparent conducting oxide integrated optical modulators and multiplexers and demultiplexers based on MEMS-tunable optical ring resonators.

20 Claims, 23 Drawing Sheets

(51) Int. Cl.
*H04B 10/40* (2013.01)
*G02B 6/293* (2006.01)
*H04B 10/50* (2013.01)

(52) U.S. Cl.
CPC ............. *G02B 6/4295* (2013.01); *G02B 6/43* (2013.01); *H04B 10/40* (2013.01); *H04B 10/503* (2013.01); *B81B 2201/045* (2013.01)

(56) References Cited

OTHER PUBLICATIONS

Palermo et al. ("Silicon Photonic Microring Resonator-Based Transceivers for Compact WDM Optical Interconnects", IEEE, 2015 IEEE Compund Semiconductor Integrated Circuit Symposium (CSICS), 2015) (Year: 2015).*

Li et al. ("A 25 GB/s, 4.4V-Swing, AC-Coupled Ring Modulator-Based WDM Transmitter with Wavelength Stabilization in 65 nm CMOS", IEEE Journal of Solic-State Circuits, vol. 50, No. 12, Dec. 2015, pp. 3145-3159) (Year: 2015).*

Naokatsu et al., Machine Translation of JP-2020027147-A, 2020. (Year: 2020).*

Abdulla, S.M.C et al., "Tuning a racetrack ring resonator by an integrated dielectric MEMS cantilever," Optics Express (2011) 19(17):15864-15878.

Billah, M. R et al., "Hybrid integration of silicon photonics circuits and InP lasers by photonic wire bonding," Optica [2018] 5(7):876-883.

Haffner, C et al., "Nano-opto-electro-mechanical switches operated at CMOS-level voltages," Science (2019) 366:860-864.

Li, H et al., "A 25 GB/s, 4.4 V-Swing, AC-Coupled Ring Modulator-Based WDM Transmitter with Wavelength Stabilization in 6 5 nm Cmos," IEEE Journal of Solid-State Circuits (2015) 50(12):3145-3159.

Nelson, G. N et al., "Integrated Wavelength-Selective Optical MEMS Switching Using Ring Resonator Filters," IEEE Photonics Technology Letters (2005) 17(6):1190-1192.

* cited by examiner

MULTI-CHIP PHOTONICS TRANSCEIVER

RELATED APPLICATIONS

This application claims priority to U.S. Provisional Application No. 63/061,314, filed on Aug. 5, 2020, and entitled MULTI-CHIP PHOTONICS TRANSCEIVER, the entirety of which is incorporated herein by reference. This application also claims priority to U.S. Provisional Application No. 63/061,301, filed on Aug. 5, 2020, and entitled MEMS-TUNABLE OPTICAL RING RESONATOR, and to corresponding U.S. Non-Provisional application Ser. No. 17/391,126, filed on Aug. 2, 2021, and entitled MEMS-TUNABLE OPTICAL RING RESONATOR, the entirety of each of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a compact, low power, multi-chip photonics transceiver employing microelectromechanical system (MEMS) technology.

BACKGROUND

In photonics systems, light is employed in connection with transmission of data over a transmission medium such as an optical fiber. With more particularity, a conventional photonics transceiver includes processing circuitry, light emitting devices, and photodetectors. With respect to data transmission, the processing circuitry generates data that is to be transmitted to a recipient device. Light emitted by the light emitting devices (e.g., lasers) is modulated to encode the data output by the processing circuitry in the light. The (modulated) light is transmitted to a recipient device by way of the optical fiber. With respect to data receipt, photodetectors are optically coupled to an optical fiber and detect light that has been transmitted to the photonics system by way of the optical fiber, wherein the light has data encoded thereon. A photodetector outputs an electrical signal based upon the detected light, and the processing circuitry decodes the data from the electrical signal. Photonics systems are often employed in applications where the speed at which data is to be transmitted is important and where secure data transmission is important.

Conventional photonics transceivers have several deficiencies: 1) conventional photonics systems require a relatively large amount of power to transmit and receive data, and 2) conventional photonics systems have a relatively low areal bandwidth density (e.g., conventional photonics systems can transmit and receive a relatively small amount of data relative to the size of the photonic system). The first deficiency is at least partially caused by the power required by the light emitting devices, the modulators, the multiplexers, and the demultiplexers that are used in conventional photonics systems. For example, the multiplexers and demultiplexers employed in conventional photonics system require precise temperature control, wherein such temperature control requires a relatively large amount of power. The second deficiency is at least partially caused by 1) the spacing of through silicon vias (TSVs) on conventional chips, and 2) the size of conventional multiplexers and demultiplexers that are employed in photonics transceivers.

SUMMARY

The following is a brief summary of subject matter that is described in greater detail herein. This summary is not intended to be limiting as to the scope of the claims.

Described herein is a photonics transceiver that exhibits various advantages over conventional photonics transceivers. For example, the photonics transceiver described herein has improved areal bandwidth density when compared to areal bandwidth densities of conventional photonics transceivers. In another example, the photonics transceiver described herein has reduced energy consumption per bit when compared to energy consumption per unit area of conventional photonics transceivers. With more specificity, the photonics transceiver described herein is capable of an areal bandwidth density that exceeds approximately 5 Tbps/mm$^2$ with an energy consumption of less than approximately 500 fJ/bit (sum of energy consumed for both a transmitted bit and a received bit). In an exemplary embodiment, the energy consumption of the photonics transceiver can be approximately 200 fJ/bit (or less) while maintaining an areal bandwidth density of at least approximately 5 Tbps/mm$^2$.

As will be described in greater detail herein, the photonics transceiver can be a multi-chip module (MCM) that comprises a complementary metal-oxide semiconductor (CMOS) control/logic chip and three photonics chips, wherein the three photonics chips are integrated onto the control/logic chip. The three photonics chips comprise: 1) a vertical cavity surface emitting laser (VCSEL) chip that includes several VCSEL sources, 2) a photonics integrated circuit (PIC) that includes microelectromechanical system (MEMS)-based multiplexers, MEMS-based demultiplexers, and optical modulators, and 3) a photodetector (PD) chip that includes several photodiodes. The three photonics chips are bonded to the control/logic chip and are driven by an application-specific integrated circuit (ASIC) on the control/logic chip.

To achieve the areal bandwidth density referenced above, electrical interconnect pitches of approximately 20 μm electrically couple circuitry on the photonics chips with circuitry on the control/logic chip. This is accomplished by way of through silicon vias (TSVs) on such chips, wherein the TSVs have a pitch of approximately 20 μm. Energy savings are realized through the use of modulators that are external to the VCSELs on the VCSEL chip, and further by way of the MEMs multiplexers and demultiplexers on the PIC chip.

In at least one embodiment of the present invention, a photonics transceiver comprises a first chip that includes a plurality of light sources (each of the plurality of light sources continuously emitting a corresponding wavelength of light), a second chip that includes a plurality of photodetectors (each of the plurality of photodetectors producing a corresponding signal indicative of a received magnitude of light), a third chip that includes Tx componentry including a wavelength division multiplexer (the wavelength division multiplexer including a first plurality of tunable ring resonators and each of the first plurality of tunable ring resonators being optically coupled to a respective one of the plurality of light sources), and Rx componentry including a wavelength division demultiplexer (the wavelength division demultiplexer including a second plurality of tunable ring resonators and each of the second plurality of tunable ring resonators being optically coupled to a respective one of the plurality of photodetectors), and a fourth chip that comprises control/logic circuitry (the fourth chip electrically coupled to the first chip, the second chip, and the third chip).

In various embodiments, each of the plurality of light sources includes a corresponding vertical cavity surface emitting laser (VCSEL); the plurality of VCSELs are formed on a non-planar substrate, the non-planar substrate includes a ridge, and the ridge includes a tapered width; a lower portion of the plurality of VCSELs is formed on a planar substrate, a portion of the lower portion of the plurality of VCSELs is removed using a binary etch process, and an upper portion of the plurality of VCSELs is formed on the binary etched lower portion of the plurality of VCSELs; each of the plurality of light sources emits light at a different wavelength from each remaining one of the plurality of light sources and a wavelength spacing between the different wavelengths of light is approximately 1 nm; and the plurality of light sources is optically coupled to the Tx componentry by a first set of micro-optics and the plurality of photodetectors is optically coupled to the Rx componentry by a second set of micro-optics.

In other embodiments, the Tx componentry of the third chip includes a plurality of modulators (each of the plurality of modulators optically coupled to a respective one of the plurality of light sources, each of the plurality of modulators is electrically coupled to the circuitry of the fourth chip), and the control/logic circuitry controls the plurality of modulators to modulate light received from the plurality of light sources to encode data that is to be transmitted by the optical transceiver on the light; and each of the plurality of modulators includes a transparent conducting oxide integrated optical modulator.

In still other embodiments, each of the first plurality of tunable optical ring resonators and each of the second plurality of tunable optical ring resonators comprises a resonator ring (the resonator ring having a minimum free spectral range of 1 nm), a tuner ring that is positioned directly above the resonator ring (the tuner ring having a minimum free spectral range of 1 nm, the tuner ring moving in a direction normal to a plane of the resonator ring), a top electrode that is mechanically coupled to the tuner ring, a bottom electrode that is mechanically coupled to the resonator ring, and one or more springs each of which are mechanically and electrically coupled to the top electrode, a respective resonant wavelength of a respective resonator ring being tunable by applying a respective voltage between a respective top electrode and a respective bottom electrode.

In yet other embodiments, each of the one or more springs is one of an external folded spring, an external linear segment spring, an external multi-linear segment spring, an external cantilever spring, an internal folded spring, an internal linear segment spring, an internal multi-linear segment spring, or an internal cantilever spring; each of the one or more springs is one of an internal folded spring, an internal linear segment spring, an internal multi-linear segment spring, or an internal cantilever spring; and each resonator ring includes one of Si, $Si_3N_4$, $Al_2O_3$, $LiNbO_3$, or $Ta_2O_5$ and each tuner ring includes $SiO_2$ or $Si_3N_4$.

In additional embodiments, the Tx componentry of the third chip includes a plurality of monitor photodetectors (each of the plurality of monitor photodetectors is optically coupled to a corresponding one of the plurality of light sources and produces a corresponding signal indicative of a received magnitude of light); the third chip includes a first fiber receptacle optically coupled to the Tx componentry and a second fiber receptacle optically coupled to the Rx componentry; and the first fiber receptacle is optically coupled to the Tx componentry by a first set of micro-optics and the second fiber receptacle is optically coupled to the Rx componentry by a second set of micro-optics.

In yet other additional embodiments, the first chip is flip-chip bonded to the fourth chip, the second chip is flip-chip bonded to the fourth chip, and the third chip is flip-chip bonded to the fourth chip; the third chip is bonded to the fourth chip via a plurality of through silicon vias; the transceiver consumes less than 500 fJ/bit; the transceiver comprises at least eight transmit channels and at least eight receive channels; and the transceiver has an areal bandwidth density of at least 5 Tbps/mm$^2$ when transmitting data and an areal bandwidth density of at least 5 Tbps/mm$^2$ when receiving data.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
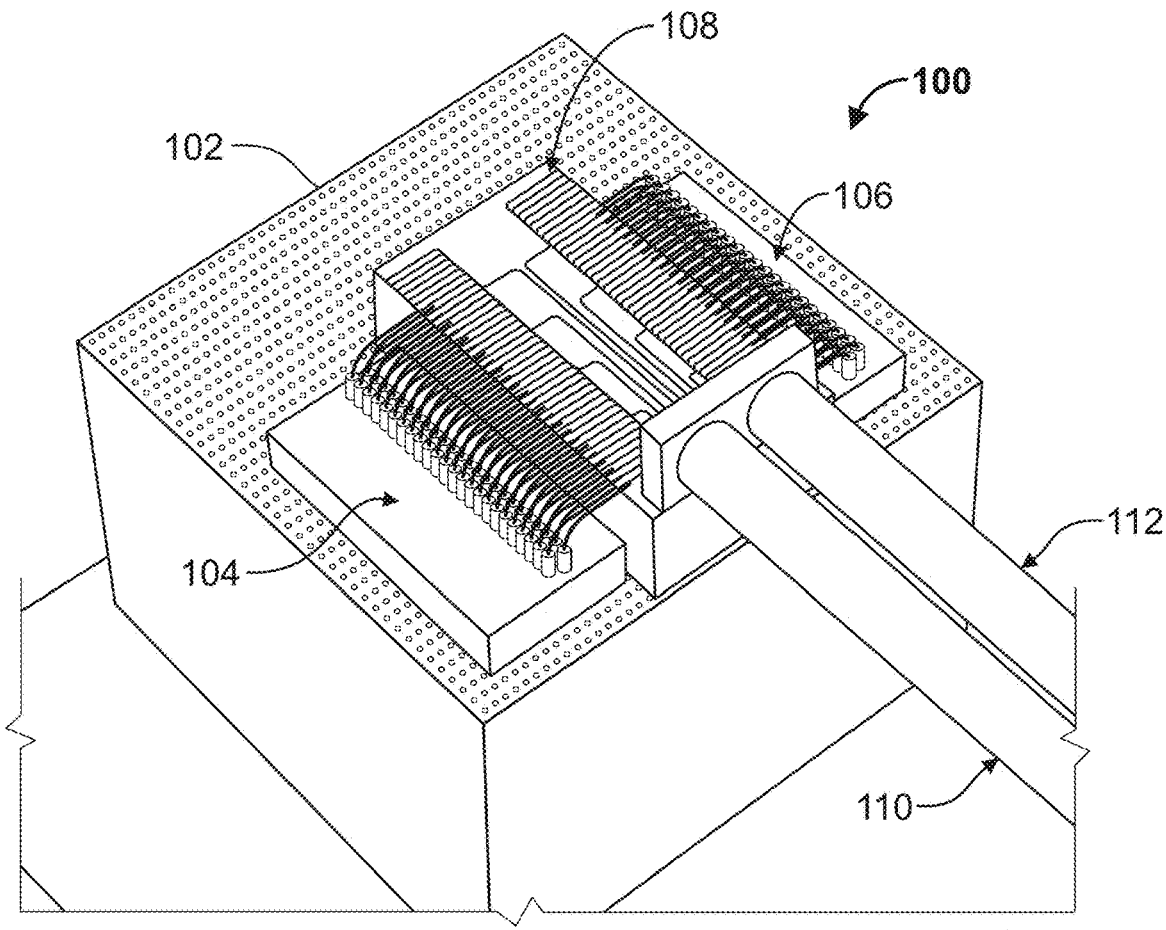
FIG. 1 is an isometric view of an exemplary photonics transceiver in accordance with one or more embodiments of the present invention.

Various technologies pertaining to a photonics transceiver with relatively high areal bandwidth density and relatively low power consumption are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A, X employs B, or X employs both A and B. In addition, the articles "a" and "an" as used in this application and the appended claims should generally be construed to mean "one or more" unless specified otherwise or clear from the context to be directed to a singular form.

Described herein is a photonics transceiver that exhibits various advantages over a conventional photonics transceiver. The photonics transceiver described herein is smaller in size when compared to conventional photonics transceivers, consumes less energy per bit than conventional photonics transceivers, and has a higher bandwidth when compared to conventional photonics transceivers.

With reference now to FIG. 1, an isometric view of an exemplary photonics transceiver 100 is depicted. The photonics transceiver 100 includes four chips that are integrated with one another. The photonics transceiver 100 includes a CMOS control/logic chip 102, wherein the control/logic chip 102 can be approximately 2 μmm×2 μmm×1 μmm in size. The photonics transceiver 100 additionally includes a vertical cavity surface emitting laser (VCSEL) chip 104 that is, for example, flip-chip bonded to an underside of the control/logic chip 102. The VCSEL chip 104 includes several VCSELs. For example, the VCSELs can be gallium arsenide (GaAs)-based VCSELs. Further, the VCSELs can include any suitable number of VCSELs. For instance, the VCSELs can include 8 VCSELs, 16 VCSELs, 24 VCSELs, 32 VCSELs, 40 VCSELs, 48 VCSELs, and so forth. In an exemplary embodiment, the VCSELs can be high-slope-efficiency 980 nm VCSELs, wherein each VCSEL can be driven by a current that is less than or equal to approximately 1 mA.

The photonics transceiver 100 also comprises a photodetector (PD) chip 106 that comprises several PDs (e.g., photodiodes). Similar to the VCSEL chip 104, the PD chip 106 can be flip-chip bonded to the underside of the control/logic chip 102. The PD chip 106 can include any suitable number of PDs. For instance, the PDs can include 8 PDs, 16 PDs, 24 PDs, 32 PDs, 40 PDs, 48 PDs, etc. In an exemplary embodiment, the PDs can be indium-gallium-arsenide (InGaAs) PDs that are lattice-matched on an indium phosphide (InP) substrate. In another example, the PDs can be InGaAs PDs and the substrate of the PD chip 106 can be GaAs.

The photonics transceiver 100 also includes a photonics integrated circuit (PIC) 108 that is flip-chip bonded to the underside of the control/logic chip 102 and is further optically coupled to the VCSELs in the VCSEL chip 104 and optically coupled to the PDs in the PD chip 106. As will be described in greater detail below, the PIC 108 comprises microelectromechanical system (MEMS)-based multiplexers, MEMs-based demultiplexers, and modulators.

The photonics transceiver 100 also includes a pair of optical fibers 110 and 112, wherein the optical fibers 110 and 112 respectively include multiple cores. For example, the optical fiber 110 may include at least 6 optical cores and the optical fiber 112 may include at least 6 optical cores. Each of the optical cores can carry eight wavelength division multiplexed (WDM) channels. Thus, when the photonics transceiver 100 includes one optical fiber for transmitting data and one optical fiber for receiving data, the photonics transceiver 100 can transmit data over 48 channels and can receive data over 48 channels. It is to be understood, however, that the photonics transceiver 100 can include any suitable number of optical fibers. For example, the photonics transceiver 100 can include 2 or 2*N optical fibers, where N is the number of integrated photonic transceiver units included in the full photonics transceiver. It is also to be understood that the optical fiber 110 and the optical fiber 112 can include any suitable number of optical cores. For example, the optical fiber 110 and the optical fiber 112 can each include 1 optical core, 2 optical cores, 3 optical cores, 4 optical cores, etc. Further, it is to be understood that each of the optical cores can carry any suitable number of WDM channels. For example, each optical core can carry 1 channel, 2 WDM channels, 4 WDM channels, 6 WDM channels, 8 WDM channels, 16 WDM channels, etc.

As indicated previously, the photonics transceiver 100 exhibits various advantages over conventional photonics transceivers. For instance, the photonics transceiver 100 has a duplex areal bandwidth density that exceeds approximately 5 Tbps/mm$^2$. In addition, the photonics transceiver 100 consumes less than approximately 500 pJ/bit. As will be described in greater detail below, to achieve the areal bandwidth density referenced above, the chips 104, 106, and 108 have electrical interconnect pitches on the order of 20 μm by way of through silicon vias (TSVs). To achieve the improved energy consumed per bit of data transmitted and/or received, modulators that are external to the VCSELs are employed to reduce serializer/deserializer power consumption. Additionally, the MEMs-based multiplexers and demultiplexers on the PIC chip 108 have near zero direct current (DC) power draw, as will be described in detail below.

Figure 2:
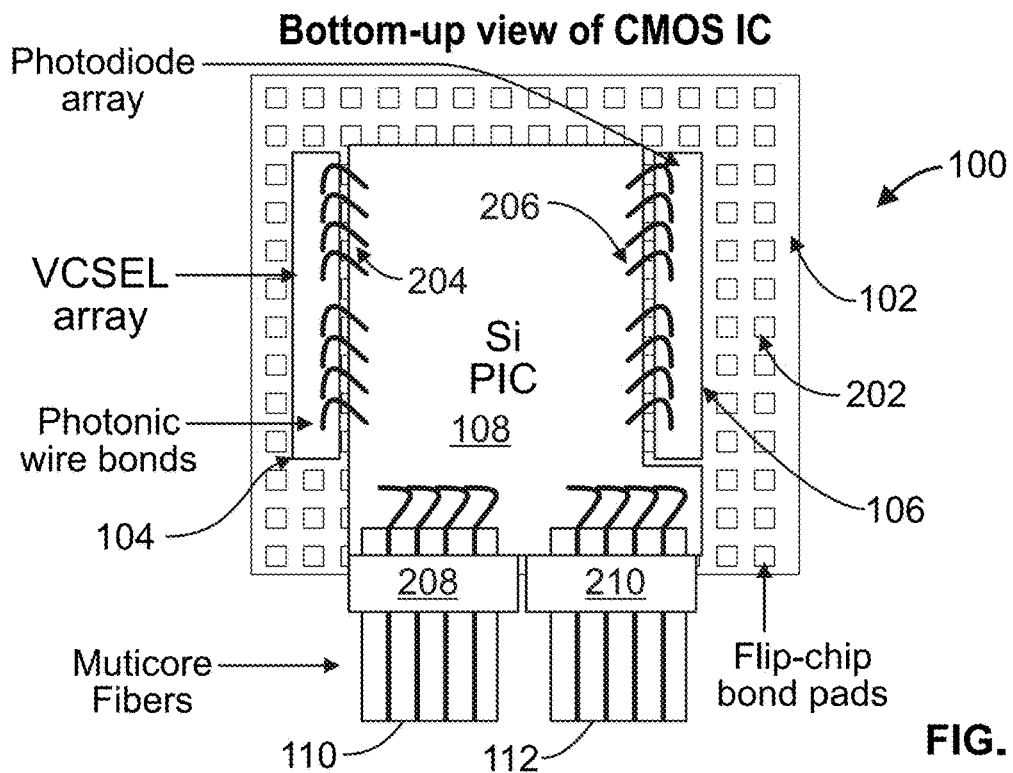
FIG. 2 is a top down view of an exemplary photonics transceiver in accordance with one or more embodiments of the present invention.

Now referring to FIG. 2, a top down view of an exemplary instantiation of the photonics transceiver 100 is depicted. In the instantiation of the transceiver 100 described herein, the transceiver 100 includes 48 VCSELs, 48 PDs, and circuitry and electronics that correspond to 48 transmit and receive channels, though only eight of each will be illustrated and described in detail for the sake of clarity. As noted above, however, the photonics transceiver 100 can include any suitable number of VCSELs, PDs, and circuit components that correspond to such VCSELs and PDs to achieve a desired number of transmit and receive channels.

The photonics transceiver 100 includes the control/logic chip 102, the VCSEL chip 104, the PD chip 106, and the PIC chip 108. FIG. 2 further depicts the optical fibers 110 and 112. The control/logic chip 102 comprises flip-chip bond pads 202, wherein the VCSEL chip 104, the PD chip 106, and PIC chip 108 can be flip-chip bonded to the control/logic chip 102 by way of the bond pads 202.

The photonics transceiver 100 includes a first set of printed or molded micro-optics 204 that optically couple the VCSELs on the VCSEL chip 104 with respective waveguides on the PIC chip 108. The photonics transceiver 100 also includes a second set of printed or molded micro-optics 206 that optically couple the PDs on the PD chip 106 with respective waveguides on the PIC 108. The multicore optical fibers 110 and 112 are coupled to the PIC 108 by way of 3D printed keyed fiber receptacles 208 and 210, respectively.

Figure 3:
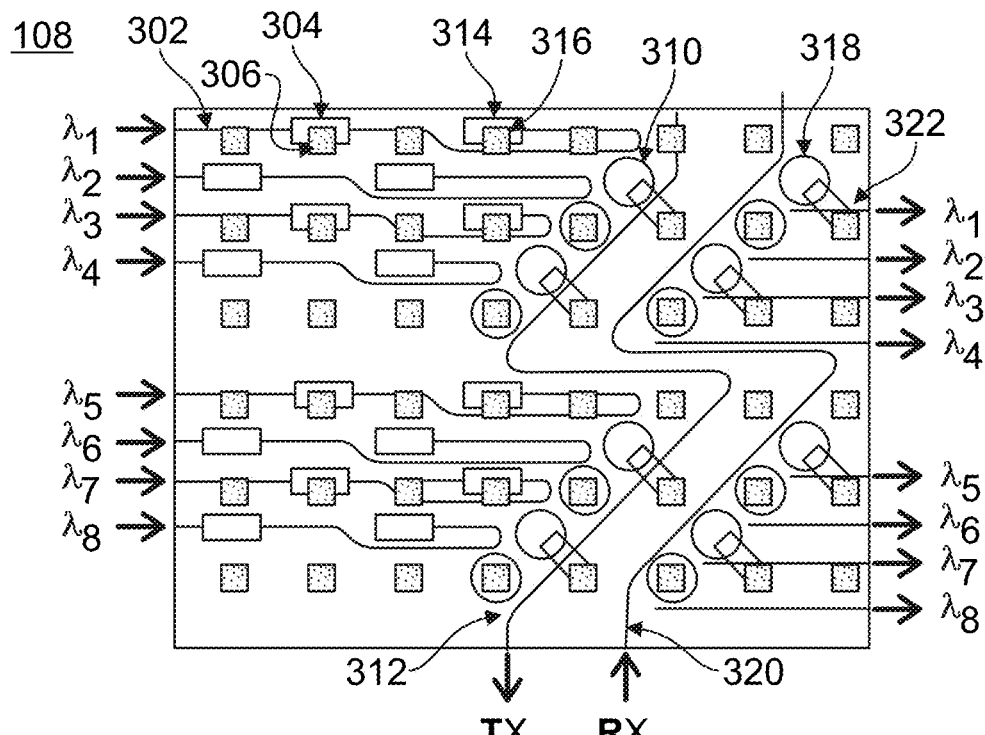
FIG. 3 is an expanded top down view of a photonics integrated circuit (PIC) chip in accordance with one or more embodiments of the present invention included in the photonics transceiver illustrated in FIG. 2.

Referring now to FIG. 3, an expanded top down view of the PIC chip 108 is depicted. The PIC chip 108 includes transmit (Tx) componentry and receive (Rx) componentry. The Tx componentry supports 8 transmit channels. Each transmit channel includes a transmit waveguide 302 (coupled to a VCSEL of the VCSEL chip 104 by way of the set of micro-optics 204), wherein the transmit waveguide 302 carries light emitted by the VCSEL. The transmit channel further includes a modulator 304 that modulates light on the transmit waveguide 302 to encode data on the light, wherein the data is to be transmitted to a photonics receiver (not shown). The modulator 304 is coupled to circuitry of the control/logic chip 102 by way of an electrical connection formed by TSVs (including a TSV 306). Thus, the modulator 304 modulates the light on the transmit waveguide 302 in accordance with instructions received from the circuitry of the control/logic chip 102, and the modulated light is output to the transmit waveguide 302. The transmit channel further includes a MEMS-tunable ring resonator 310 that is positioned proximate the transmit waveguide 302 and proximate a transmit bus waveguide 312.

The MEMS-tunable ring resonator 310 is tuned to a wavelength of light that is emitted by the VCSEL. Light in the waveguide 302 therefore couples into the ring resonator 310 and subsequently couples into the transmit bus waveguide 312. The transmit channel also includes a monitor photodiode 314 that is optically coupled to the transmit waveguide 302. Light that does not couple into the ring resonator 310 is detected by the monitor photodiode 314. The monitor photodiode 314 is electrically coupled to circuitry of the control/logic chip 102 by way of an electrical connection established through a TSV 316, and the ring resonator 310 is tuned based upon an electrical signal generated by the monitor photodiode 314. The bus waveguide 312 is optically coupled to the multicore fiber 110, and the modulated light (with the encoded data therein) is transmitted to the photonics receiver by way of the multicore fiber 110.

As noted above, the Tx componentry includes 8 transmit channels, and therefore includes 8 transmit waveguides that are respectively optically coupled to 8 VCSELs, 8 modulators, 8 MEMS-tunable ring resonators, and 8 monitor photodiodes. The 8 VCSELs emit light of different wavelengths (e.g., a first VCSEL emits light having a first wavelength, a second VCSEL emits light having a second wavelength, etc.), and the 8 ring resonators are tuned to wavelengths of the light emitted by the 8 respective VCSELs (e.g., a first ring resonator is tuned to the first wavelength, a second ring resonator is tuned to the second wavelength, etc.). Collectively, the ring resonators multiplex light onto the transmit bus waveguide 312. The multiplexed light on the transmit bus waveguide 312 is coupled to the optical fiber 110 via the fiber receptacle 208. In an exemplary embodiment, each core of the optical fiber 110 can carry 8 wavelength division multiplexed light channels. Thus, when the optical fiber 110 includes 6 cores, the optical fiber 110 can be coupled to 48 transmit channels.

The Rx componentry supports 8 receive channels, and a receive channel includes a MEMS-tunable ring resonator 318 that is proximate a receive bus waveguide 320. The receive bus waveguide 320 is coupled to a core of the optical fiber 112 via the fiber receptacle 210, and can receive several (e.g., 8) WDM light channels that have been transmitted by a photonics transmitter to the photonics transceiver 100 by way of the core of the optical fiber 112. The receive channel further includes a receive waveguide 322 that is proximate the ring resonator 318. The ring resonator 318 is tuned to a wavelength of one of the WDM light channels that is on the receive bus waveguide 320. Thus, light of the wavelength on the receive bus waveguide 320 couples into the ring resonator 318 and subsequently couples into the receive waveguide 322. The receive waveguide 322 is optically coupled to a PD on the PD chip 106 by way of the set of micro-optics 206.

The Rx componentry supports 8 receive channels. Thus, the Rx componentry comprises 8 MEMs-tunable ring resonators (each tuned to a different wavelength) and 8 receive waveguides that are respectively optically coupled to 8 PDs on the PD chip 106. Collectively, the MEMS-tunable ring resonators of the Rx componentry act to demultiplex WDM signals that are received from the optical fiber 112. When the optical fiber 112 comprises 6 cores, the receive bus waveguide 320 can be optically coupled to a single core of the optical fiber 112. In an exemplary embodiment, the PIC chip 108 can comprise Tx componentry that supports 48 transmit channels (e.g., the Tx componentry includes 48 transmit waveguides, 48 modulators, 48 MEMS-tunable ring resonators, 48 monitor diodes, and 6 transmit bus waveguides), and the PIC chip 108 can comprise Rx componentry that supports 48 receive channels (e.g., the Rx componentry includes 6 receive bus waveguides, 48 MEMs-tunable ring resonators, and 48 receive waveguides).

Figure 4:
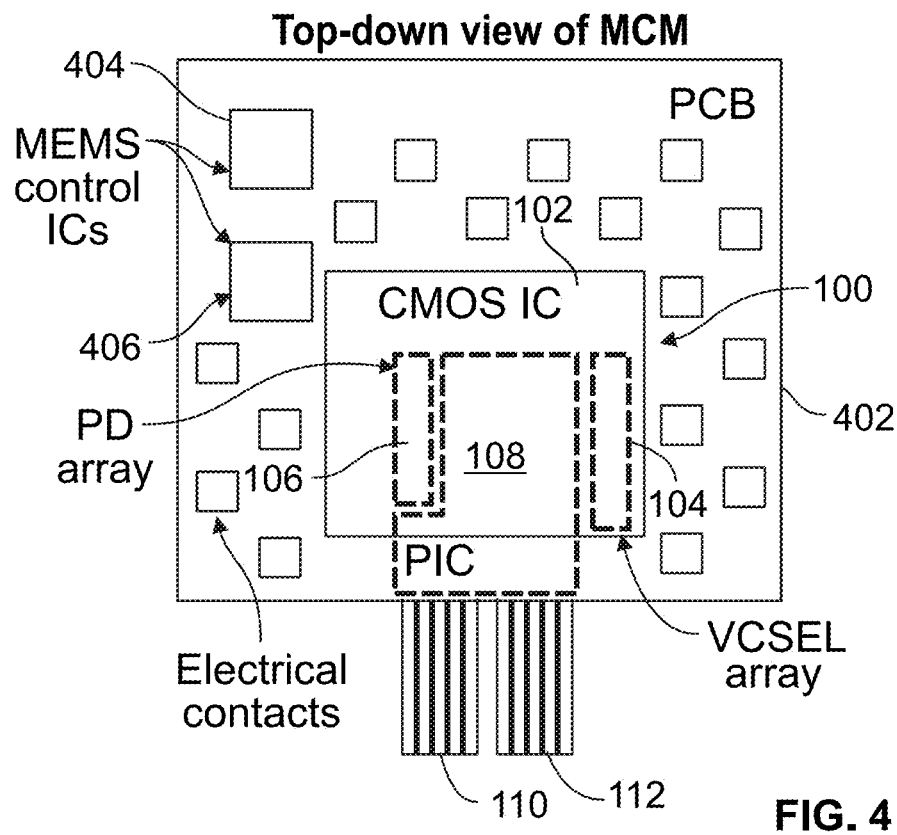
FIG. 4 is a top down view of the exemplary photonics transceiver in accordance with one or more embodiments of the present invention depicted in FIG. 2.

Referring now to FIG. 4, a top down view of the photonics transceiver 100 is presented. In the example shown in FIG. 4, the photonics transceiver 100 is bonded to a printed circuit board (PCB) 402. A pair of integrated circuits (ICs) 404 and 406 are electrically coupled to the PCB 402 by way of suitable electrical contacts. In an exemplary embodiment, the IC 404 is configured to control the MEMS-tunable ring resonators in the Tx componentry on the PIC chip 108, and the IC 406 is configured to control the MEMS-tunable ring resonators in the Rx componentry on the PIC chip 108. Thus, the ICs 404 and 406 are electrically coupled to the PIC 108 by way of, for example, the control/logic chip 102, and are configured to tune the ring resonators to the desired wavelengths.

Figure 5:
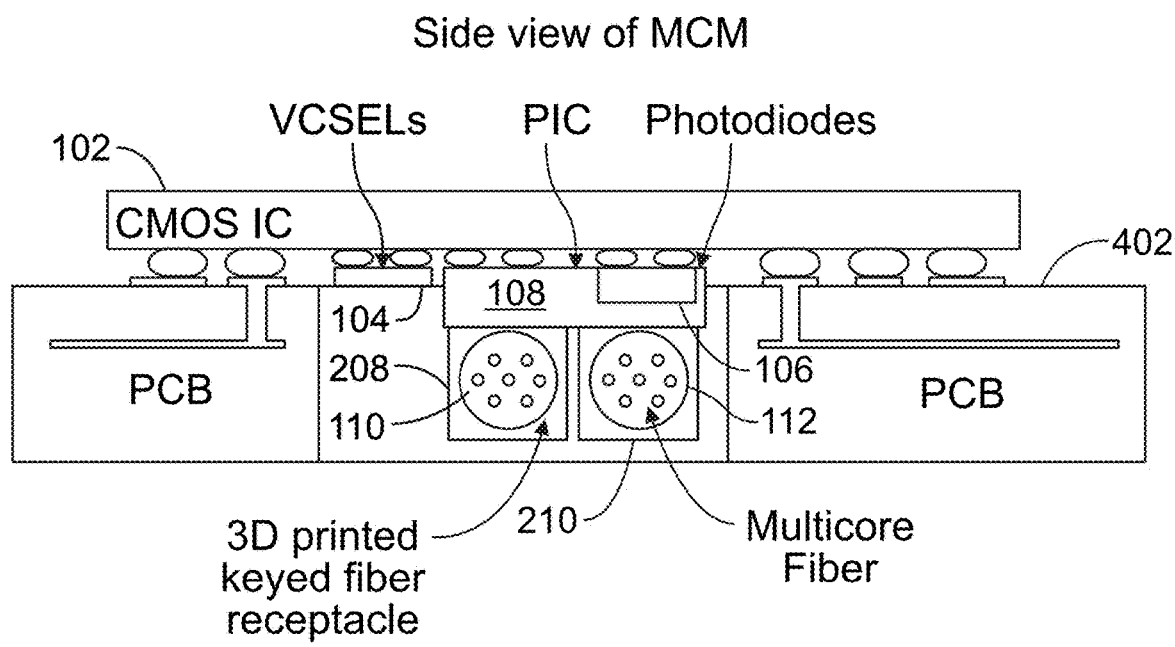
FIG. 5 is a side view of the exemplary photonics transceiver depicted in FIG. 2.

FIG. 5 is a side view of the photonics transceiver 100, which illustrates that the VCSEL chip 104, the PD chip 106, and the PIC chip 108 are flip-chip bonded to the control/logic chip 102. The control/logic chip 102 is bonded to the PCB 402. In an exemplary embodiment, the VCSEL chip 104, the PD chip 106, and the PIC chip 108 can be bonded to the control/logic chip 102 by way of gold (Au) microbumps and low-temperature (e.g., approximately 200° C.) thermocompression bonding. Electrical connection to the PIC chip 108 is made to the back (non-device) side of the PIC chip 108, for example, by way of copper-plated TSVs.

As noted above, the photonics transceiver 100 has a relatively high areal bandwidth density, which is at least partially due to TSVs having approximately a 20 μm pitch and an aspect ratio of 20:1. In an exemplary embodiment, the TSVs can be created through use of a TSV-last integration approach as an enabler for high density heterogeneous integration of componentry on the chips 102, 104, 106, and 108 of the photonics transceiver 100, and can be filled with copper (Cu). In connection with achieving TSVs with the above-referenced pitch and aspect ratios, substrates of the chips are thinned, deep reactive ion etching (DRIE) is employed to form the TSVs, thin film deposition is employed for insulation and seed layers, and electrodeposition is undertaken to fill the TSVs.

Conventional limits for DRIE are approximately 20:1 aspect ratio before etch stop occurs. Due to etch depth limits, the interconnect pitch of 20 μm, and TSV diameter of 5 μm, the depth of the TSVs is limited to not greater than approximately 100 μm. After wafer thinning, the vias are etched and land on the underside of the routing layer of the PIC chip 108. Atomic layer deposition is used to deposit $Al_2O_3$ as an insulating layer. Atomic layer deposition is further used to deposit platinum (Pt), which serves both as a barrier layer and as the seed metal for subsequent electrodeposition. Additives in the plating chemistry are used to localize the Cu plating to the bottom of the TSV (despite the conformal and continuous Pt seed metal).

Conventionally, a three additive plating electrolyte is used to achieve bottom-up superfilling in high aspect ratio features. With respect to the photonics transceiver 100, however, recent developments in single additive (suppressor only) electrolytes based on the S-shaped negative differential resistance (S-NDR) model can be leveraged for electrodeposition. Such model is dependent on electrolyte composition, applied bias, and fluid transport within the vias, which is affected by the geometry of the TSVs. The ratio of Cl— and suppressor concentration in the chemistry (as well as stepped potential for progressively filling the vias) is adapted to achieve a void free fill in these geometries. Additional information may be found in provisional patent application No. 63/149,836, also assigned to the Applicant, the entirety of which is incorporated herein by reference.

Multi-layer doped polysilicon can be used for electrical routing (as opposed to metal) to accommodate the need for downstream high-temperature anneals that are associated with the silicon nitride ($Si_3N_4$) optical waveguides on the PIC chip 108. This high-temperature annealing step also necessitates the TSV-last rather than TSV-first approach. Interconnects between routing layers are similarly fabricated of doped polysilicon damascene vias.

Figure 6:
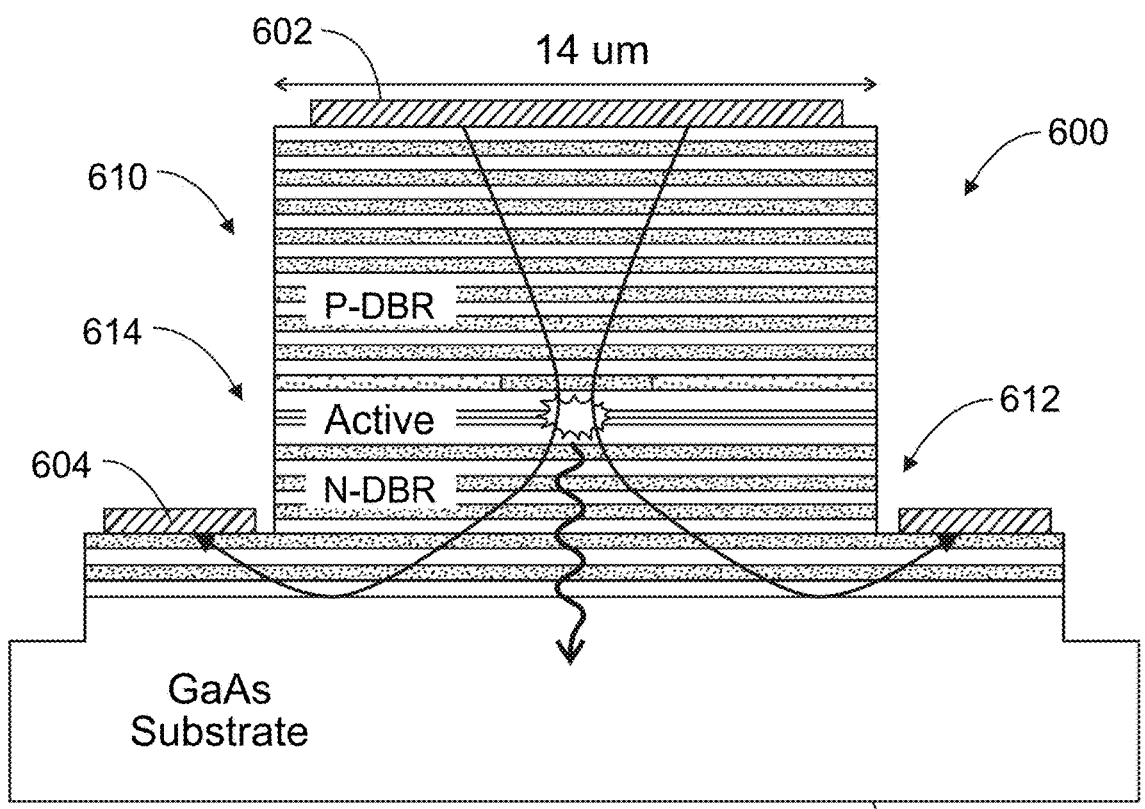
FIG. 6 is a cross-sectional view of an exemplary bottom-emitting VCSEL in accordance with one or more embodiments of the present invention.
Figure 7:
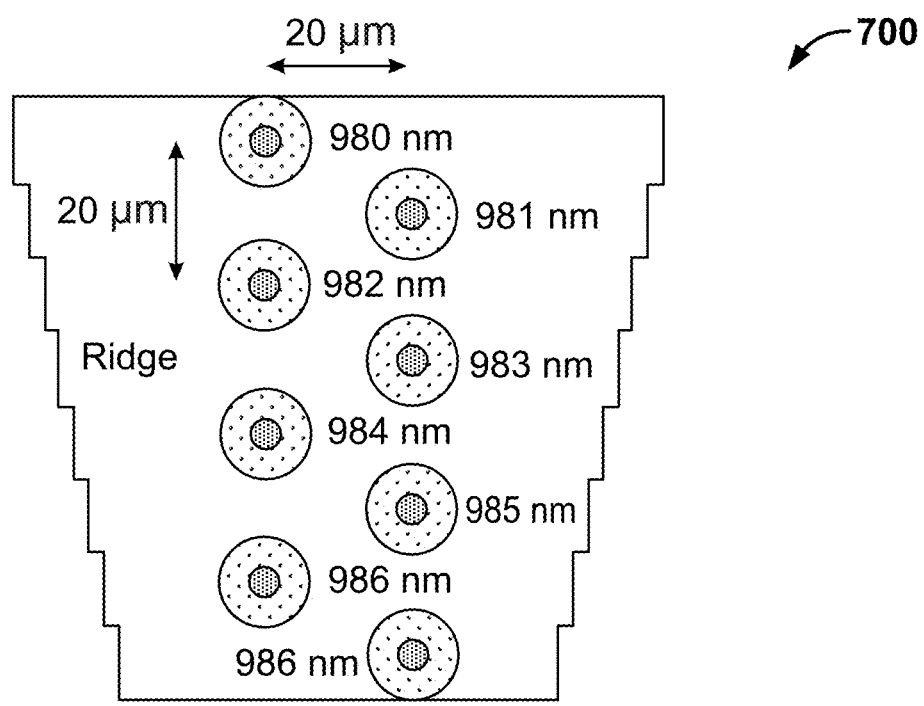
FIG. 7 is a schematic plan view of an eight wavelength VCSEL array arranged on a 20 µm pitch in accordance with one or more embodiments of the present invention.

Referring now to FIG. 6, a cross-sectional view of an exemplary VCSEL 600 that can be included in the VCSEL chip 104 is illustrated. In an exemplary embodiment, the VCSEL 600 can achieve greater than 30% efficiency at an optical power of 125 µW per wavelength. The VCSEL 600 can be included in an array of VCSELs on the VCSEL chip 104, wherein (for example) the VCSEL is a 980 nm bottom-emitting VCSEL. VCSELs in the array can have a channel spacing of approximately 1 nm for WDM. Therefore, the VCSEL 600 can emit light at a wavelength of 980 nm, a second VCSEL in the array can emit light at a wavelength of 981 nm, a third VCSEL in the array can emit light at a wavelength of 982 nm, etc. In an example, the array can consist of 8 VCSELs. The VCSELs in the array can be continuous wave (CW) VCSELs, operated in a single mode (longitudinal, spatial, and polarization), and coupled into a single-mode waveguide modulator (as will be described in greater detail below with reference to FIG. 12). The bottom-emitting format reduces the parasitics due to electrically coupling the VCSEL chip 104 to the control/logic chip 102. A relatively small diameter, for example 14 µm for each VCSEL 600, enables formation of a compact two-dimensional array of VCSELs on a 20 µm pitch. An exemplary array of 8 VCSELs 700 arranged on a 20 µm pitch is depicted in FIG. 7, wherein the 8 VCSELs have approximately 1 nm wavelength spacing for WDM.

Returning to FIG. 6, the VCSEL 600 includes a first electrode 602 and a second electrode 604 that serve as contacts for the VCSEL 600. The exemplary VCSEL 600 is grown on a GaAs substrate 608 and comprises a p-type distributed Bragg reflector region 610, an n-type distributed Bragg reflector region 612, and an active region 614 that is positioned between the regions 610 and 612. The nominal 980 nm wavelength of the VCSEL 600 allows for the lowest threshold current and highest slope efficiency due to the relatively low transparency current density and high differential gain of InGaAs quantum wells grown on the GaAs substrate 608. Achieving low threshold current also requires relatively low output coupling values near 0.2%. To simultaneously achieve high slope efficiency requires excess resonator losses due to absorption, scattering, and diffraction be below 0.05%.

The VCSEL 600 has a threshold current of approximately 0.12 mA, a slope efficiency of approximately 0.62 µmW/mA, and achieves 30% efficiency at 125 µW of output light. The relatively low drive current of 0.3 mA may limit the direct modulation bandwidth of the VCSEL 600 to less than 6 Gb/s, and accordingly the VCSEL (and the other VCSELs on the VCSEL chip 104) are used as CW sources of photons.

Figure 8:
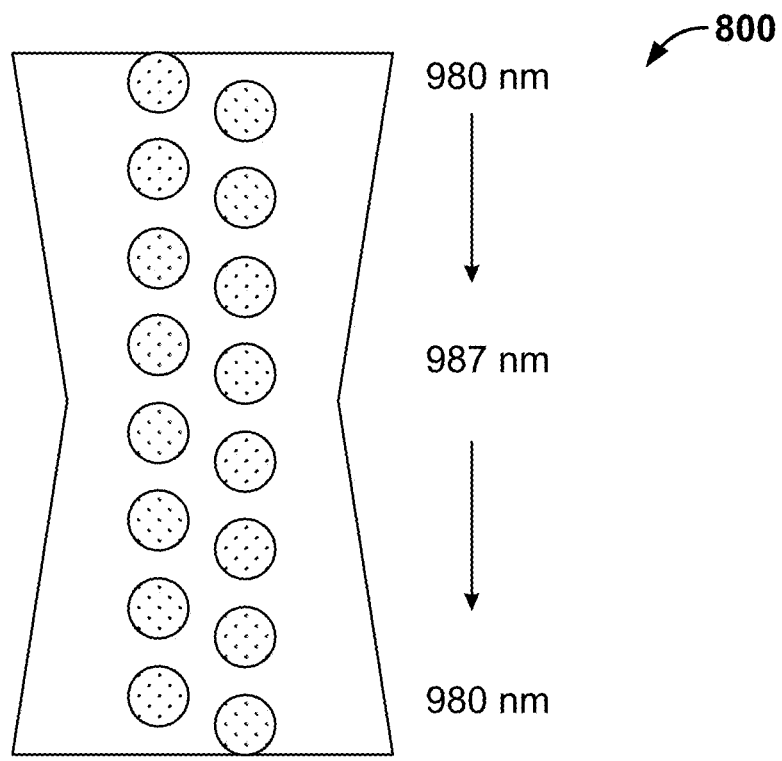
FIG. 8 is a schematic plan view of two eight wavelength VCSEL arrays arranged on a 20 µm pitch in accordance with one or more embodiments of the present invention.

Turning to FIG. 8, a schematic plan view of two adjacent, 8-wavelength VCSEL arrays 800 arranged on a 20 µm pitch is presented. As illustrated in FIG. 8, the two arrays can be arranged such that wavelengths progress from 980 nm to 987 nm and then back to 980 nm. The VCSEL epitaxy can be grown on a patterned non-planar GaAs substrate to achieve 8-element VCSEL arrays spanning a wavelength range of 7 nm (980 nm-987 nm) with a footprint of approximately 40 µm×80 µm.

Figure 9:
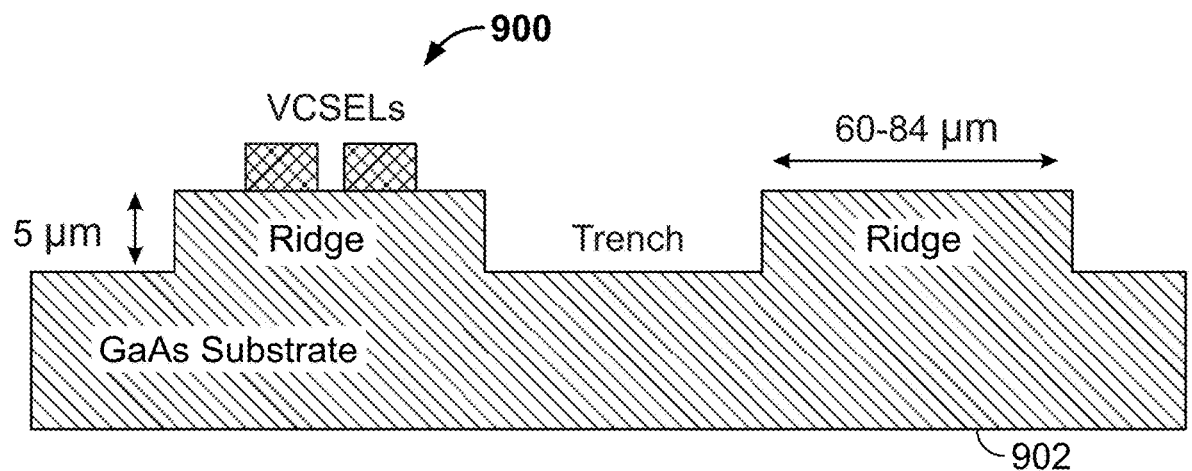
FIG. 9 is a cross-sectional view of two adjacent VCSEL arrays grown on a 5 µm tall ridge that has a width that tapers between 60 and 84 µm.

Referring to FIG. 9, a cross-sectional view of an array of VCSELs 900 grown on a ridge formed in a GaAs substrate 902 is illustrated. Before epitaxial growth, 5 µm deep trenches are etched in the GaAs substrate 902 to form a ridge having a width that tapers from 60 µm to 84 µm (where the taper can be seen in the top down views of FIGS. 7 and 8). Due to an enhancement of the MOCVD epitaxial growth rate on top of narrow ridges, 7 nm of wavelength variation across an array of 8 relatively closely-spaced VCSELs can be achieved.

Figure 10:
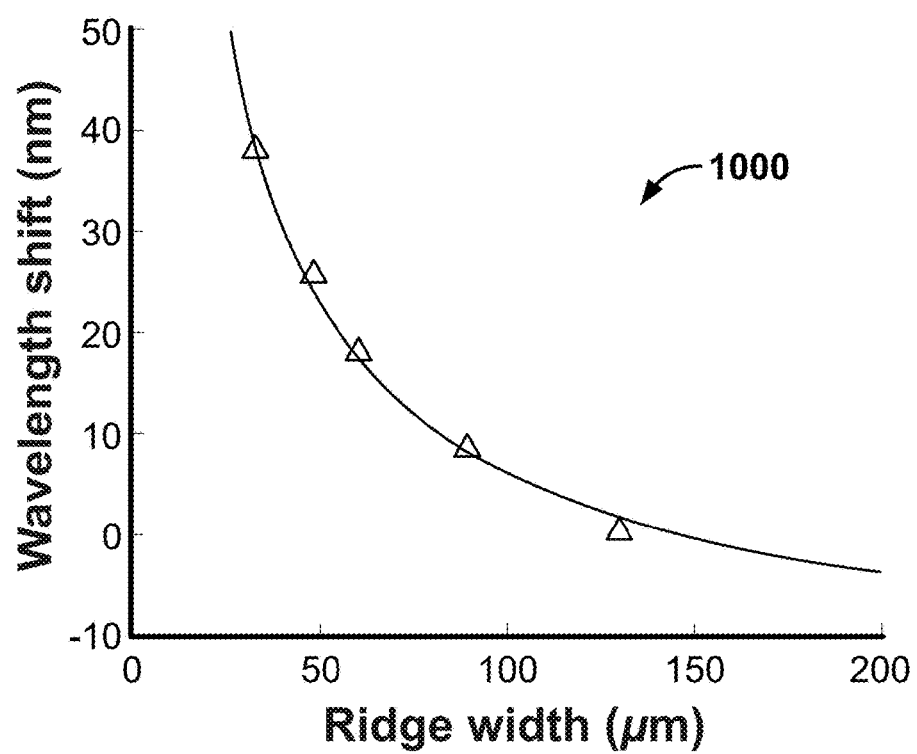
FIG. 10 is a plot that depicts wavelength shift from a nominal 980 nm wavelength versus the width of the ridge that carries a VCSEL.

FIG. 10 is a plot 1000 that depicts wavelength shift from a nominal 980 nm wavelength versus width of the ridge upon which the VCSELs are grown. Thus, by tapering the width of the ridge, the wavelength of light emitted by VCSELs in an array can be altered.

Figure 11A:
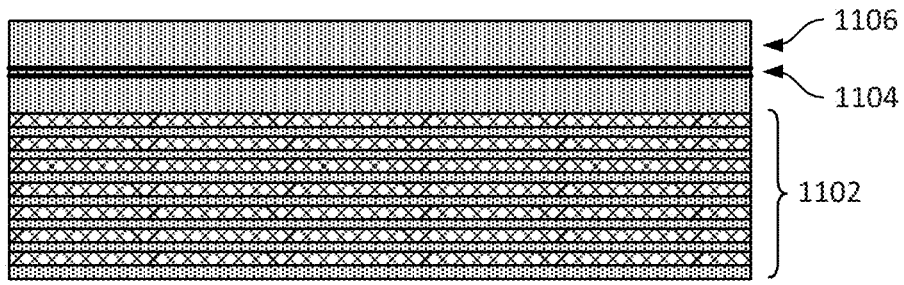
FIGS. 11A-11C illustrate an etch and regrowth process for creating an eight wavelength VCSEL array in accordance with one or more embodiments of the present invention
Figure 11B:
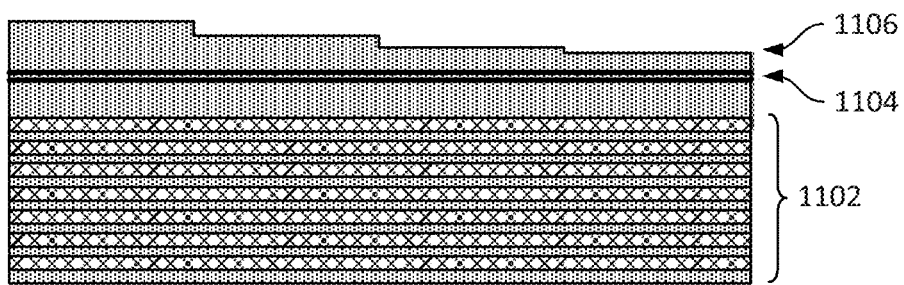
Figure 11C:
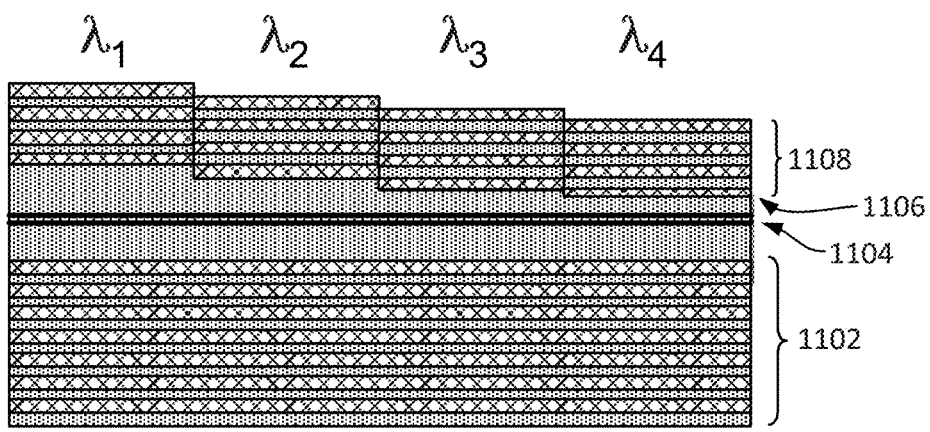

In other embodiments, the wavelength shift may be induced by using an etch/regrowth approach, as illustrated in FIGS. 11A-11C. For example, a bottom distributed Bragg reflector (DBR) mirror 1102, gain region 1104, and a buffer layer 1106 are grown on a substrate (not illustrated). Then, by using a set of three etch masks to controllably etch into the buffer layer 1106 to make it, and thus the entire optical cavity, slightly thinner in some regions that others. For 8 wavelengths, the corresponding etch depths are 4 nm, 8 nm, and 16 nm for the three etch masks. (Note that FIGS. 11B and 11C illustrate the use of only two etch masks to simplify the figures.) The longest wavelength will correspond to regions that had no etching and the shortest will be regions with 4 nm+8 nm+16 nm, i.e., 28 nm, of total etching using all three etch masks. The remaining 6 wavelengths will be various combinations of the three etch masks. This etching process using multiple masks is sometimes referred to as a binary etch process. After all of the etching is completed, the wafer with the substrate, the bottom DBR mirror 1102, the gain region 1104, and the now etched buffer layer 1106 is returned to a metalorganic chemical vapor deposition (MOCVD) reactor for growth of a top DBR mirror 1108. The resulting structure is then processed to form the VCSELs with wavelengths spanning the desired wavelength range.

Figure 12:
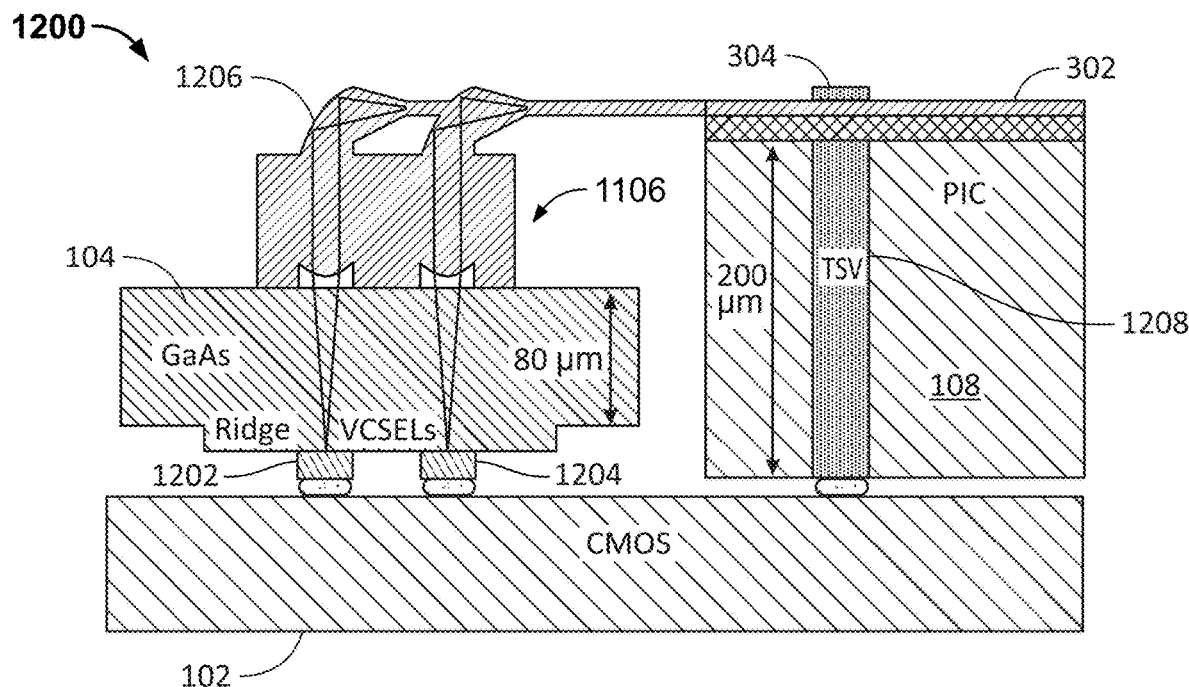
FIG. 12 is a cross-sectional side view of two adjacent bottom-emitting VCSELs coupling into two adjacent transmit waveguides in accordance with one or more embodiments of the present invention.

FIG. 12 is a cross-sectional view of a portion 1200 of the photonics transceiver 100. The portion 1200 includes the VCSEL chip 104 flip-chip bonded to the control/logic chip 102. The VCSEL chip 104 includes two bottom-emitting VCSELs 1202 and 1204. Output of the VCSELs 1202 and 1204 is optically coupled to silicon nitride ($Si_3N_4$) waveguides (e.g., including the transmit waveguide 302) on the PIC chip 108 by way of the set of micro-optics 1206 that include the set of micro-optics 204. The set of micro-optics 1206, for example, can be 3D printed utilizing a suitable tool. The PIC chip 108 includes a TSV 1208 (shown as being 200 µm in depth), wherein the modulator 304 is electrically coupled to circuitry of the control/logic chip 102 by way of TSVs that include the TSV 1208.

Figure 13A:
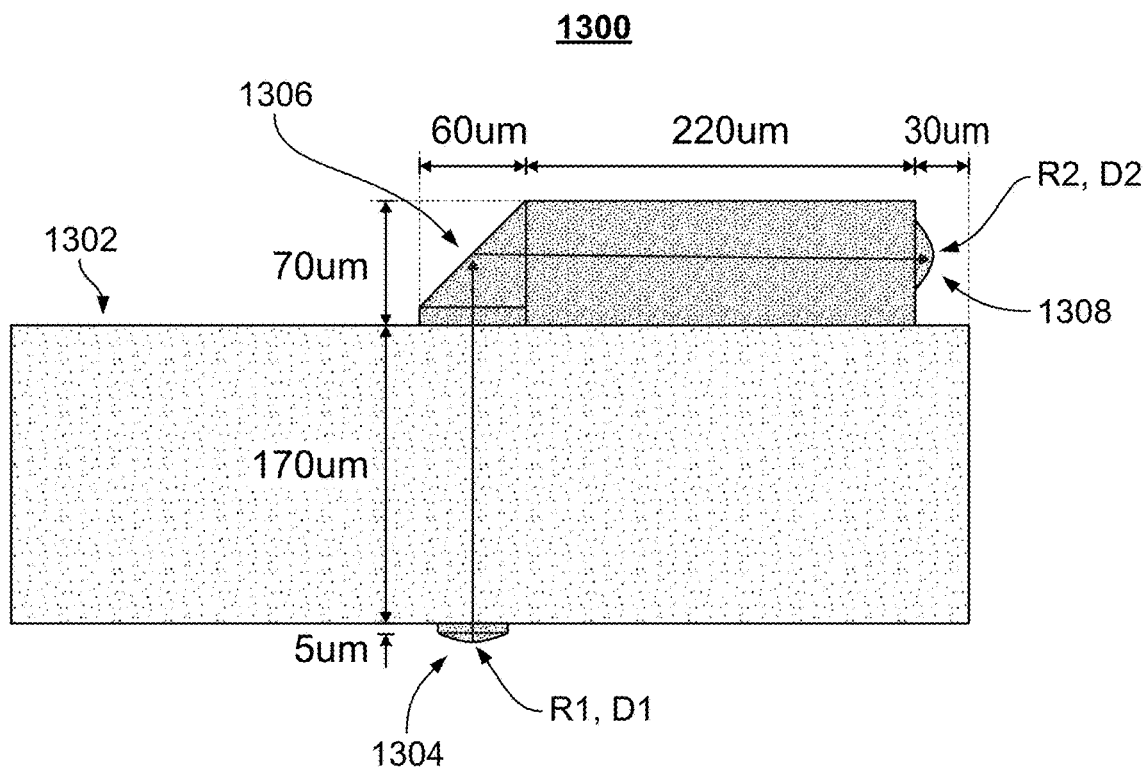
FIG. 13A is a cross-sectional side view and FIG. 13B is an isometric view of an exemplary optical integrator for coupling bottom-emitting VCSELs coupling into adjacent transmit waveguides in accordance with one or more embodiments of the present invention.
Figure 13B:
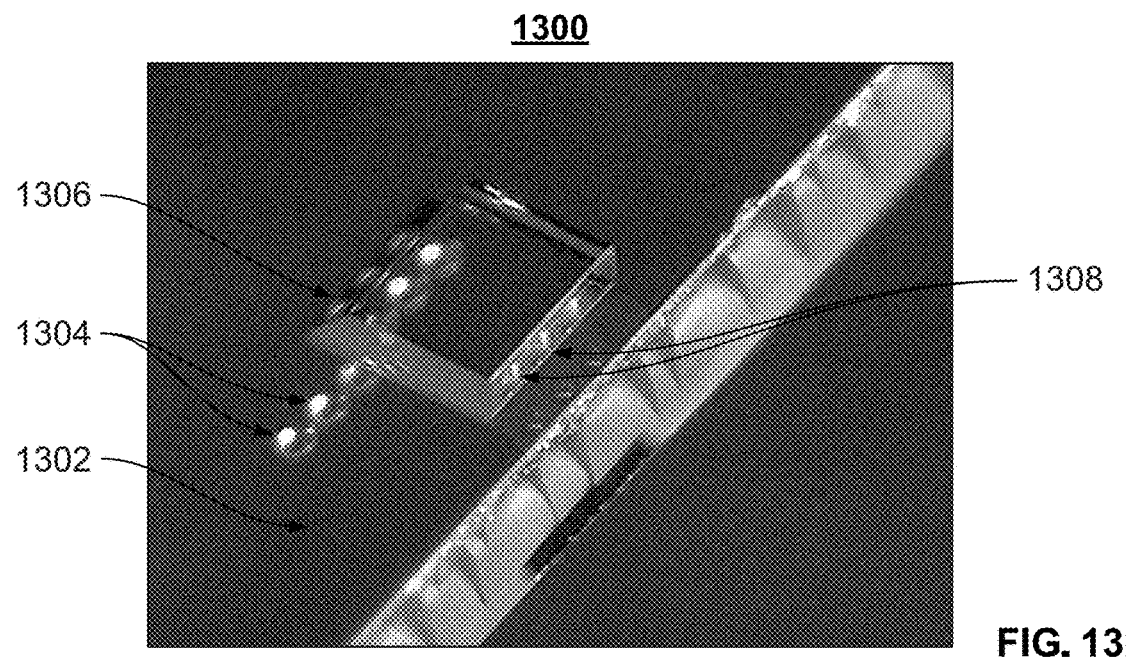

In other embodiments, the VCSEL chip 104 may be optically coupled to the PIC chip 108 by way of an optical integrator 1300, as illustrated in FIGS. 13A and 13B. For example, the optical integrator 1300 includes a glass plate 1302, a collection lens 1304, a total internal reflection mirror 1306, and a focusing lens 1308. Light from a bottom-emitting VCSEL in the VCSEL chip 104 is collected by the collection lens 1304. The light is transmitted through the glass plate 1302, reflected by the total internal reflection mirror 1306, and directed to the focusing lens 1308. The focusing lens 1308 then directs the light to the transmit waveguide 302 on the PIC chip 108.

The size and radius of curvature for both the collection lens 1304 and the focusing lens 1308 should be selected to maximize optical coupling between the bottom-emitting VCSEL in the VCSEL chip 104 and the transmit waveguide 302 on the PIC chip 108. The thickness of the glass plate 1302 should likewise be selected to maximize optical coupling between the bottom-emitting VCSEL in the VCSEL chip 104 and the transmit waveguide 302 on the PIC chip 108.

Figure 14A:
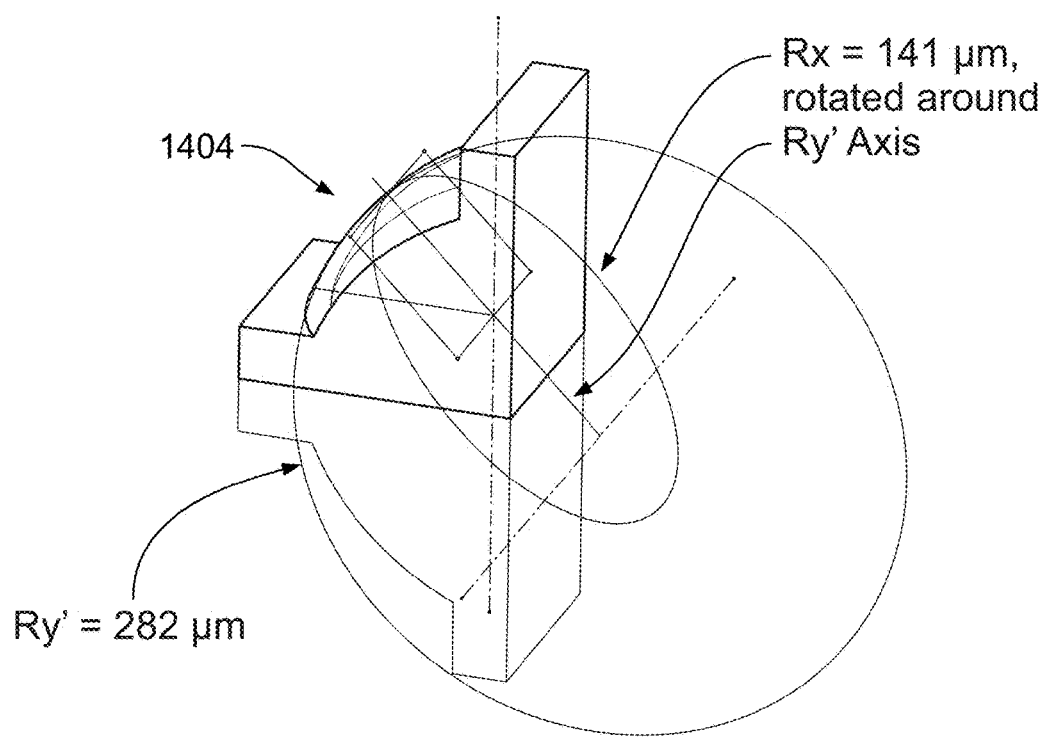
FIG. 14A is a cross-sectional side view and FIG. 14B is an isometric view of an exemplary optical integrator for coupling bottom-emitting VCSELs coupling into adjacent transmit waveguides in accordance with one or more embodiments of the present invention.
Figure 14B:
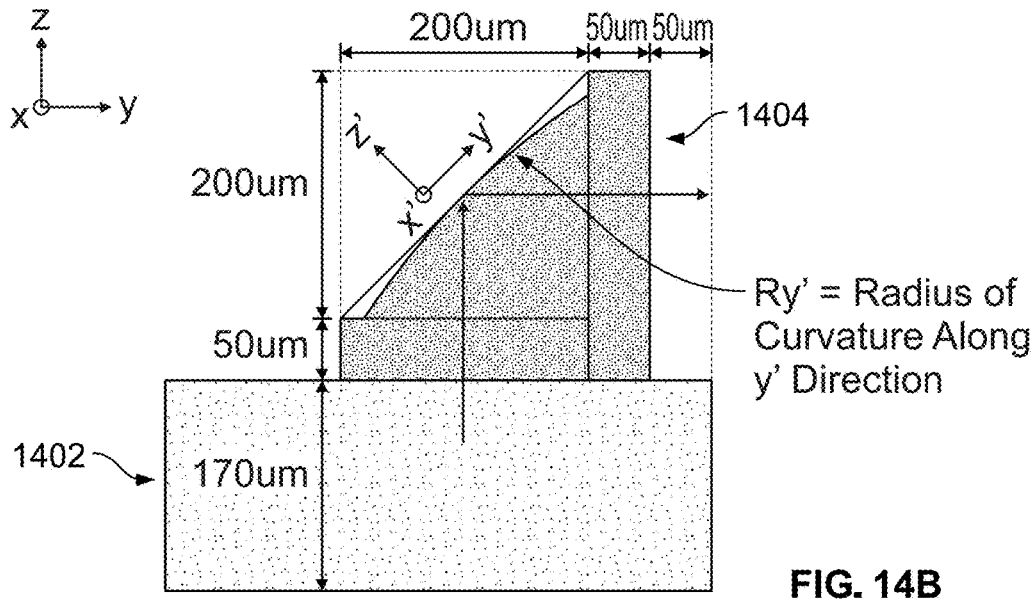

In yet other embodiments, the VCSEL chip 104 may be optically coupled to the PIC chip 108 by way of an alternative optical integrator 1400, as illustrated in FIGS. 14A and 14B. For example, the optical integrator 1400 includes a glass plate 1402 and a parabolic reflector 1404. The parabolic reflector 1404 both collects and reflects light from a bottom-emitting VCSEL in the VCSEL chip 104, and then directs the light to the transmit waveguide 302 on the PIC chip 108. The parabolic reflector 1404 may have a different radius of curvature in the X and Y directions, as illustrated in FIG. 14B, to ensure the correct focal length to maximize optical coupling between the bottom-emitting VCSEL in the VCSEL chip 104 and the transmit waveguide 302 on the PIC chip 108.

Figure 15:
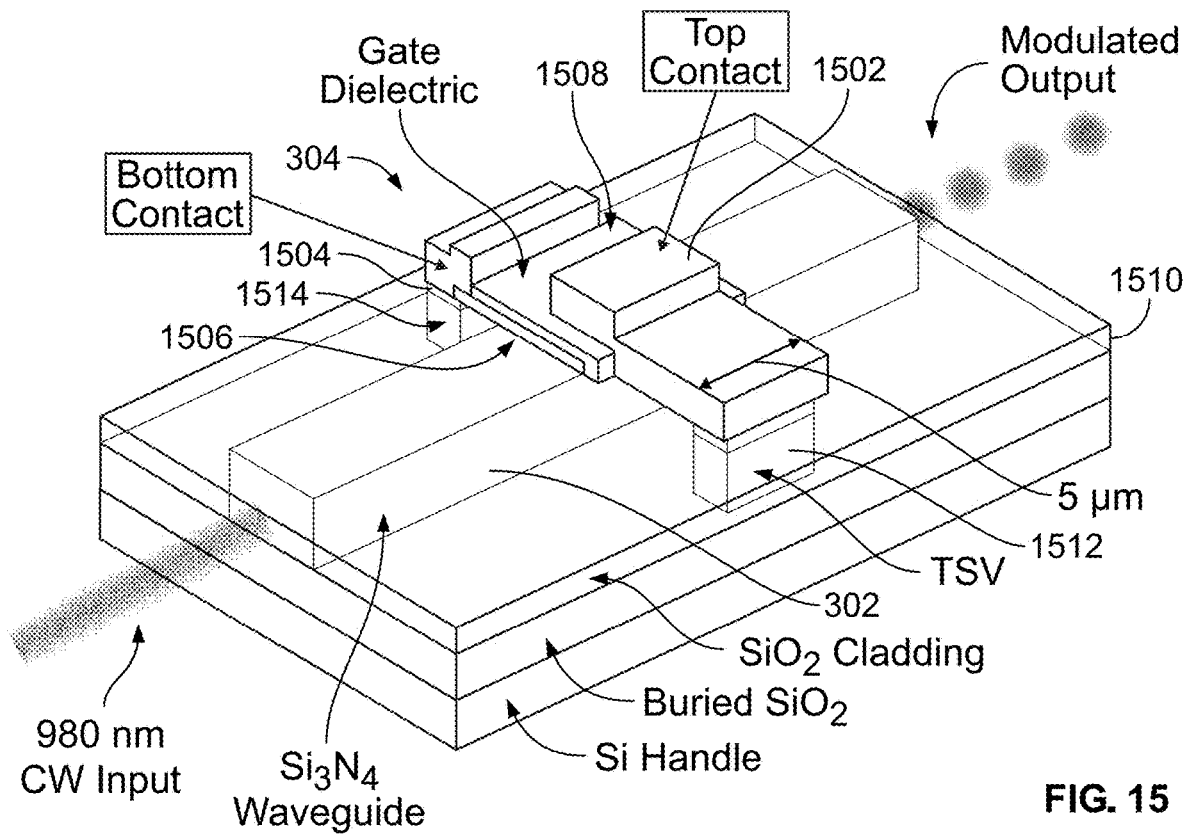
FIG. 15 is an isometric view of an exemplary modulator that is included in the exemplary photonics transceiver in accordance with one or more embodiments of the present invention.
Figure 16:
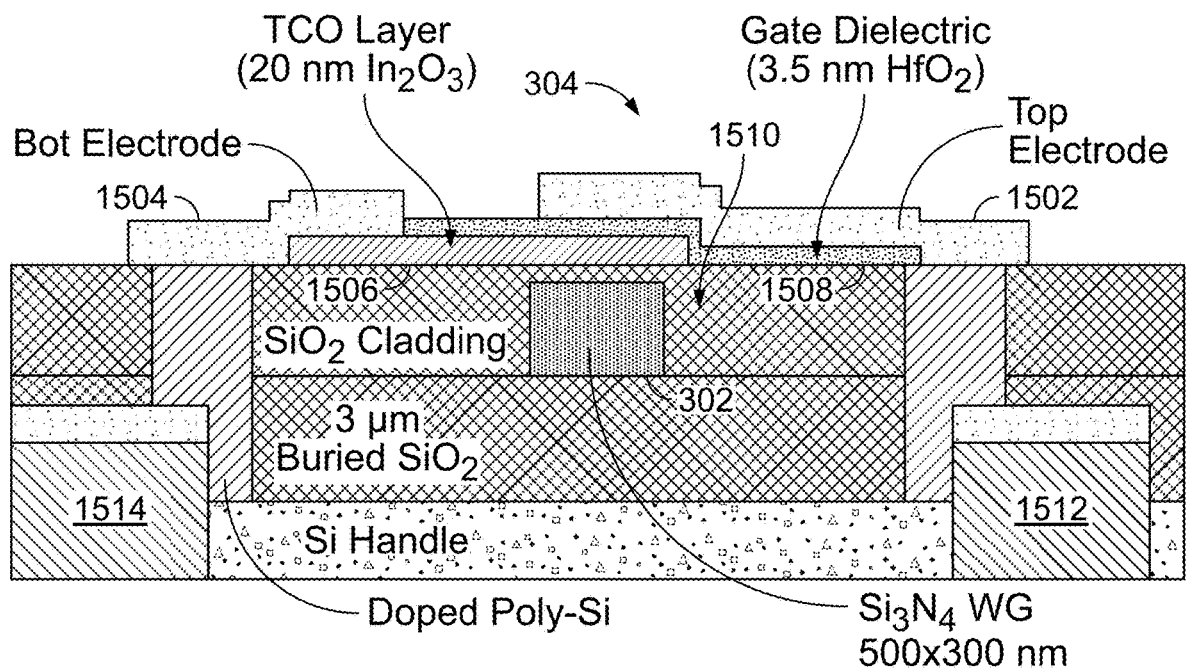
FIG. 16 is a cross-sectional view of the exemplary modulator in accordance with one or more embodiments of the present invention.

Now referring to FIGS. 15 and 16, FIG. 15 is an isometric view of a portion of the PIC chip 108 that includes the modulator 304, and FIG. 16 is a cross-sectional view of a portion of the PIC chip 108. The modulator 304 can be a transparent conducting oxide (TCO) integrated optical modulator. The modulator 304, which is an integrated optical plasmonic modulator, achieves a significant reduction in link power consumption compared to direct modulation of a VCSEL. Direct modulation at a high bandwidth requires operating a VCSEL at high current levels, such as on the order of 8 mA. In contrast, through use of the (external) modulator 304, the VCSEL current can be limited to less than 0.5 mA. Compact, broadband optical plasmonic modulators in a Si photonics platform based on carrier density tuning of the epsilon-near-zero (ENZ) wavelength in conducting oxides such as $In_2O_3$ and CdO have been demonstrated. Active regions of these ENZ modulators have a strong light-matter interaction, which leads to short device lengths (on the order of 5 μm) and optically broadband operation without requiring thermal tuning elements.

For compatibility with high-efficiency 980 nm VCSELs, the above-referenced modulator technology can employ a $Si_3N_4$ waveguide-based platform while simultaneously increasing the radio frequency (RF) bandwidth and decreasing the power consumption through a reduction in the device capacitance. The modulator 304 includes a top electrode 1502 and a bottom electrode 1504 that are electrically coupled to circuitry of the control/logic chip 102 by way of TSVs 1512 and 1514. In the modulator 304, a TCO layer 1506 and a gate dielectric layer 1508 are integrated above an etched $Si_3N_4$ ridge waveguide (e.g., the waveguide 302), wherein the waveguide 302 has a height of approximately 300 nm and a width of approximately 500 nm, and further wherein the waveguide 302 is clad with a layer of $SiO_2$ 1510 that is approximately 50 nm in height over the waveguide 302. In an example, the TCO layer 1506 can be $In_2O_3$ and the dielectric layer 1508 can be $HfO_2$. The TCO layer 1506 can serve as both a bottom contact and the active ENZ material of the modulator 304. As deposited, the TCO layer 1506 has a bulk background concentration of approximately $8.6 \times 10^{20}$ cm$^{-3}$.

Figure 17:
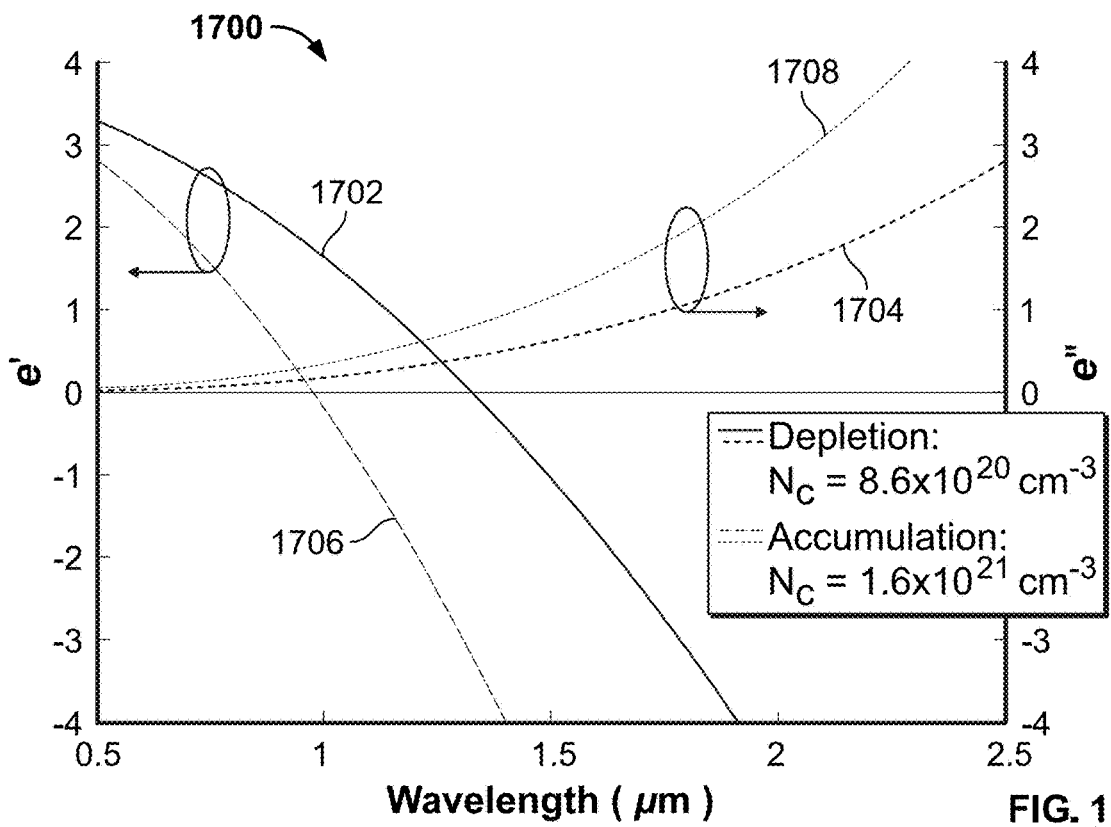
FIG. 17 is a plot that depicts transparent conducting oxide (TCO) material properties as a function of carrier concentration and wavelength.

Referring to FIG. 17, a plot 1700 that depicts features of the TCO layer 1506 is presented. Permittivity of the TCO layer 1506 is given by the set of curves 1702 and 1704. For wavelengths near 980 nm, the TCO layer 1506 acts as a relatively low-loss dielectric. When a voltage bias is applied to the top electrode 1502, carriers accumulate in the region of the TCO layer 1506 near the top electrode 1502. This accumulation of carriers occurs in an approximately 1 nm thick layer at the interface of the TCO layer 1506 and the gate dielectric layer 1508 and results in a shift in the permittivity profile as described by the Drude model. A carrier concentration of approximately $1.6 \times 10^{21}$ cm$^{-3}$ shifts the ENZ wavelength to 980 nm, significantly enhancing the optical electric field in the ENZ/accumulation layer and simultaneously increasing the material loss as seen in the curves 1706 and 1708. Electro-absorption modulation is then achieved by using the MOS capacitor gate voltage to turn on and off optical enhancement and loss in the TCO layer 1506.

Figure 18:
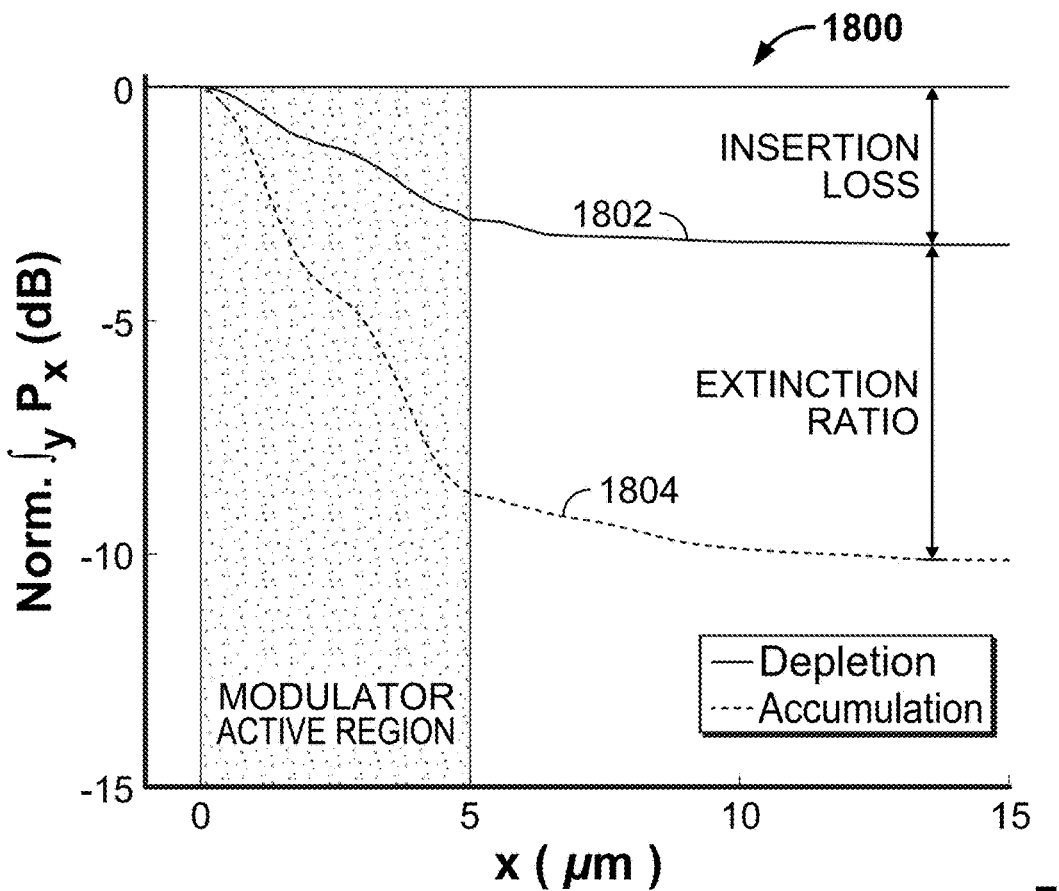
FIG. 18 is a plot that depicts the finite difference time domain modeling results for a TCO modulator integrated above a waveguide.

As a proof of concept demonstration, finite-difference time-domain (FDTD) modeling of the modulator 304 was undertaken. For ease of fabrication and to minimize the device capacitance, the modulator 304 is designed to operate in transverse magnetic (TM) mode (e.g., $E_y$ dominant). FIG. 18 is a plot 1800 that depicts a comparison of the power contained in the waveguide while passing through the modulator 304, wherein the modulator 304 has an active region with a length of 5 μm and an operating wavelength of 980 nm biased in depletion (curve 1802) and accumulation (curve 1804). Strong attenuation of the input light with an absorption of 10.2 dB is observed in the accumulation state. The attenuation when the TCO is in depletion gives a measurement of the insertion loss (IL) of 3.4 dB, giving a modular extinction ratio (ER) of more than 6.8 dB The voltage required to switch between the two states represented by curves 1802 and 1804 in FIG. 18 can be estimated as follows:

$$V = \frac{\Delta N \cdot q \cdot t_{acc} \cdot t_{ox}}{\epsilon_r \cdot \epsilon_0}, \quad \text{(Eq. 1)}$$

where V is the applied voltage, ΔN is the difference in the number of charge carriers, $q=1.602 \times 10^{-19}$ C is the elementary charge, $t_{acc}=1$ nm is the thickness of the accumulation layer, $t_{ox}=3.5$ nm is the thickness of the $HfO_2$ gate dielectric, $\epsilon_r=25$ is the relative permittivity of $HfO_2$, and $\epsilon_0=8.854 \times 10^{-12}$ F/m is the vacuum permittivity. For $\Delta N=7.2 \times 10^{20}$ cm$^{-3}$, a voltage swing of 1.8 V results. Such voltage swing is compatible with the CMOS drive architecture, as will be described below.

As a non-resonant modulator, the maximum modulation speed is limited by the RC time constant of the drive circuitry (rather than the photon lifetime). Based on the $8.6 \times 10^{20}$ cm$^{-3}$ background doping level of the $In_2O_3$ bottom electrode and prior measurements of carrier mobility of 30 cm$^2$/(V-s), the series resistance is estimated to be 60Ω. The configuration shown in FIGS. 15 and 16 has an estimated device capacitance of 158 fF, giving an RC-limited bandwidth of 16.8 GHz.

Exemplary details pertaining to the transmit ring resonator 310 and the receive ring resonator 318 are now set forth. In the photonics transceiver 100, as described above, the resonators 310 and 318 are respectively employed for wavelength division multiplexing of optical signals and wavelength division demultiplexing of optical signals. In an exemplary embodiment, the resonators 310 and 318 are MEMS-tunable optical ring resonators that are capable of being operated over a relatively wide range of temperatures. In other exemplary embodiments, in addition to and/or as an alternative to the transmit ring resonators and/or receive ring resonators, the photonics transceiver 100 can include tunable VCSELs (where the VCSELs are tunable by way of current injection), thermally-isolated microring heaters, multiplexers based on the TOC modulator 304, Echelle gratings, free carrier, electro-optic, or coupled photonic crystal cavities, etc.

Reference is now made solely to the transmit ring resonators in the Tx componentry of the photonics transceiver 100, however, the discussion below is also applicable to the receive ring resonators in the Rx componentry of the photonics transceiver 100. The ring resonators collectively are capable of accepting data of at least 32 Gb/s, which implies an approximately 0.2 nm or larger linewidth and a quality factor Q of 5000 or less at 980 nm in waveguides with an effective index $n_{eff}$ of approximately 1.56. To avoid crosstalk between channels, the laser wavelength spacing, as noted above, can be approximately 1 nm (or five times the design linewidth of each ring resonator on the PIC chip 108). A wavelength division multiplexer can comprise eight ring resonators and is therefore capable of multiplexing eight wavelength channels. This necessitates an 8 nm or larger free-spectral range (FSR) to avoid simultaneous resonance with two channels. In an example, the ring resonator 310 can have a FSR of 10 nm, and thus can have a ring radius of $$10 \ \mu m = \frac{980 \text{nm}^2}{2\pi n \cdot FSR}$$

or less for both the tuner ring and the resonator ring. For full flexibility, the wavelength division multiplexer should tune the resonant wavelength by an entire 10 nm FSR, which is equivalent to 1% of the operating wavelength. This 1% range in wavelength tuning in turn leads to a requirement of 1% effective index tunability. As illustrated in FIG. 3, multiplexing or demultiplexing can be achieved with a series of eight MEMS-tunable optical ring resonators coupled to each bus waveguide 312 and 320 on the PIC chip 108. As will be appreciated by those of ordinary skill, the tuning range is also a function of the overall system architecture, including, for example, the number of operating wavelengths and the wavelength spacing between the operating wavelengths. Thus, with other system architectures, the desired or required tuning range may be less than the FSR of the MEMS-tunable optical ring resonator. As will also be appreciated by those of skill in the art, the desired minimum FSR will likewise be a function of the overall system architecture. For example, the FSR for both the tuner ring and the resonator ring may preferably be at least as great as the difference between the longest and shortest operating wavelengths. In a system with a single operating wavelength, a minimum FSR of 1 nm is preferred to provide the desired degree of tunability and tuning finesse.

Figure 19:
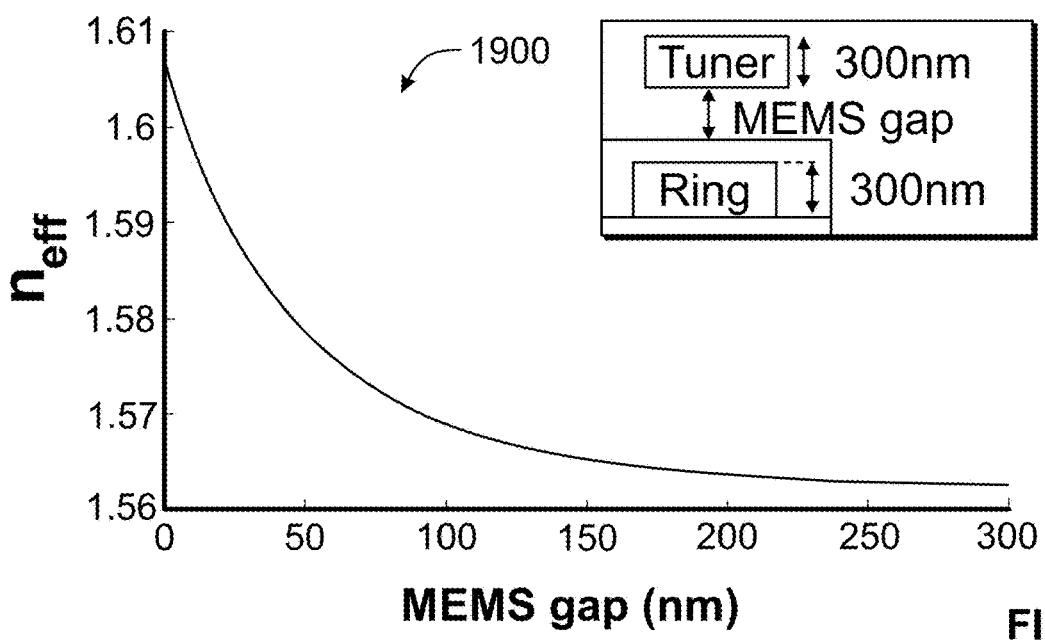
FIG. 19 is a plot that depicts silicon nitride waveguide effective index change as a function of the size of a gap to a silicon dioxide tuner in accordance with one or more embodiments of the present invention.

To keep the laser on resonance while accomplishing wavelength tuning over 10 nm, a MEMS-tunable optical ring resonator employs vertical-actuation, with the effective index of a fixed $Si_3N_4$ ring being controlled by varying the vertical gap between a (moveable) $SiO_2$ ring and the $Si_3N_4$ ring. FIG. 19 is a plot 1900 that depicts a simulation that illustrates the effective index tuning of the waveguide TM mode assuming an initial air gap of 300 nm, where the air gap can be varied from 40 to 300 nm. As illustrated, more than 1% effective index tuning is achievable when the width of the air gap is reduced from 300 nm to 40 nm.

Figure 20:
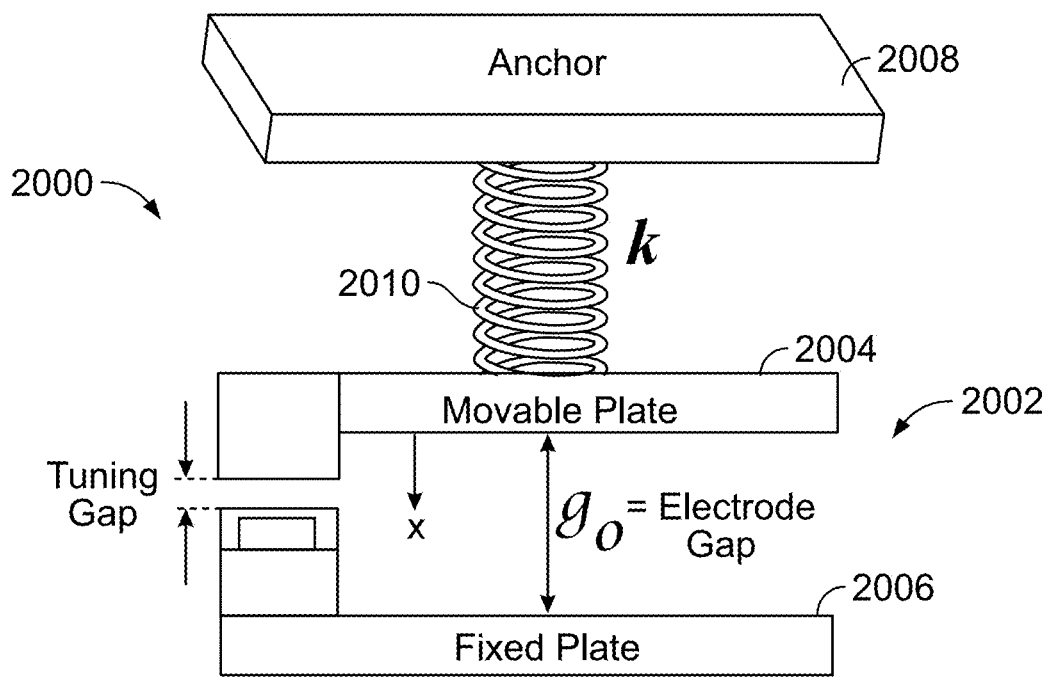
FIG. 20 is a schematic that depicts an exemplary microelectromechanical system (MEMS) tuner.

Now referring to FIG. 20, a schematic depicting an exemplary MEMS tuner 2000 is illustrated. The MEMS tuner 2000 of the ring resonator 310 can be viewed as a capacitor 2002 with a movable top electrode 2004 and a fixed electrode 2006, forming a gap therebetween. The gap between the two electrodes 2004 and 2006 (and between a tuner ring 2302 and a resonator ring 2304, described below with reference to FIGS. 23 and 24) is voltage-controlled, and the movable electrode 2004 is clamped to an anchor 2008 via a spring 2010 that has a designable spring constant k. Electrostatic pull-in must be accounted for, which occurs when a displacement x of a top electrode 2004 is ⅓ the original gap go. Accordingly, the electrode (air) gap must be at least three times the desired displacement range. In an exemplary embodiment, the initial electrode gap can be 3·300 nm+25% (1.125 μm). The voltage required to achieve a desired displacement, x, is given by:

$$V = \frac{1}{\epsilon_{ox}} \sqrt{\frac{2kx(\epsilon_{air} \, d_{ox} + \epsilon_{ox} \, (d_{air} - x))^2}{\epsilon_{air} \, A}}, \qquad \text{(Eq. 2)}$$

where A is the overlap area of the two electrodes 2004 and 2006, $\epsilon_{air}$ and $\epsilon_{ox}$ are the permittivities of air and the oxide between the electrodes 2004 and 2006, respectively, and $d_{air}$ and $d_{ox}$ are the thicknesses of the air gap and the oxide between the electrodes 2004 and 2006, respectively.

A design consideration involves permanent and destructive pull-in due to stiction. A rough rule of thumb is that the spring of restoring force at pull-in should be at least 10 μN to avoid permanent stiction (assuming small area dimple contact structures without electro-migration). Stiction places a lower limit on the spring stiffness.

Figure 21A:
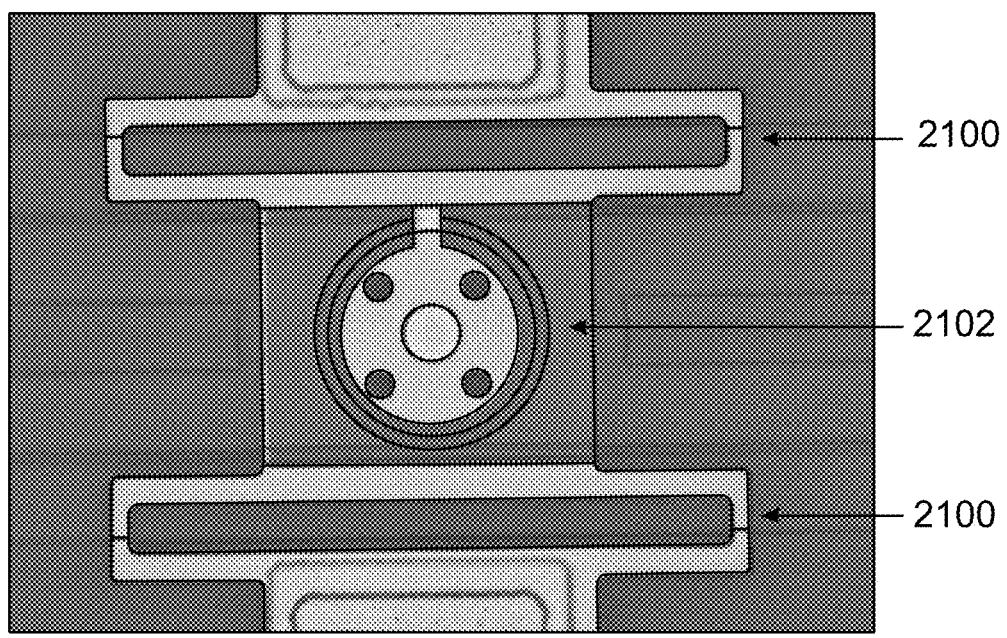
FIGS. 21A-21C are images of exemplary springs that may be employed in accordance with one or more embodiments of the present invention.
Figure 21B:
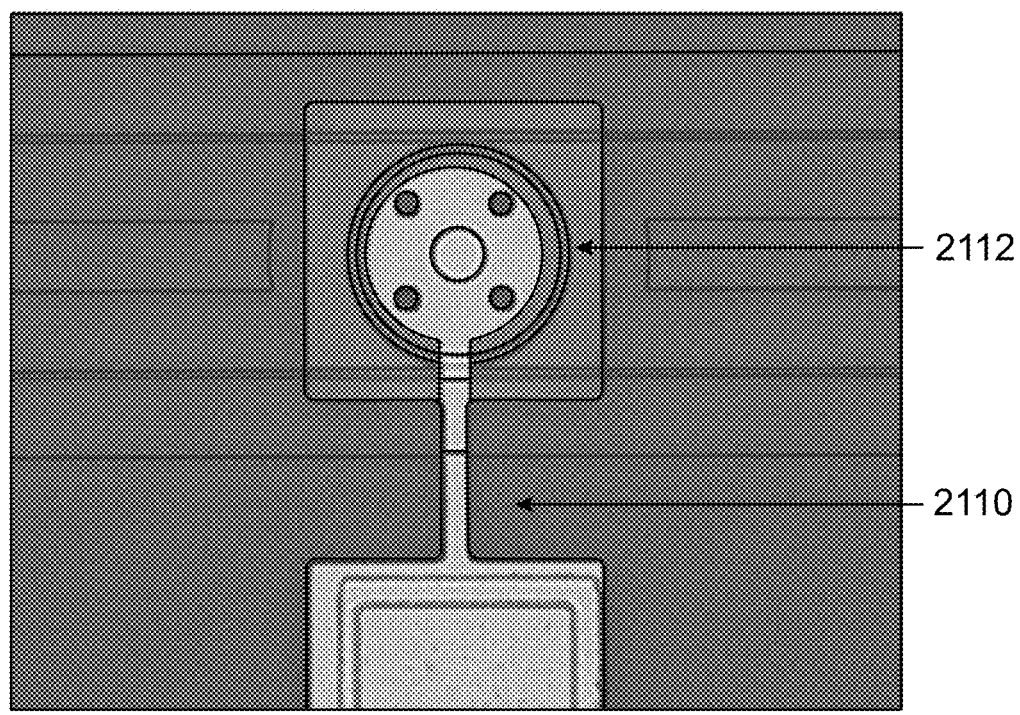
Figure 21C:
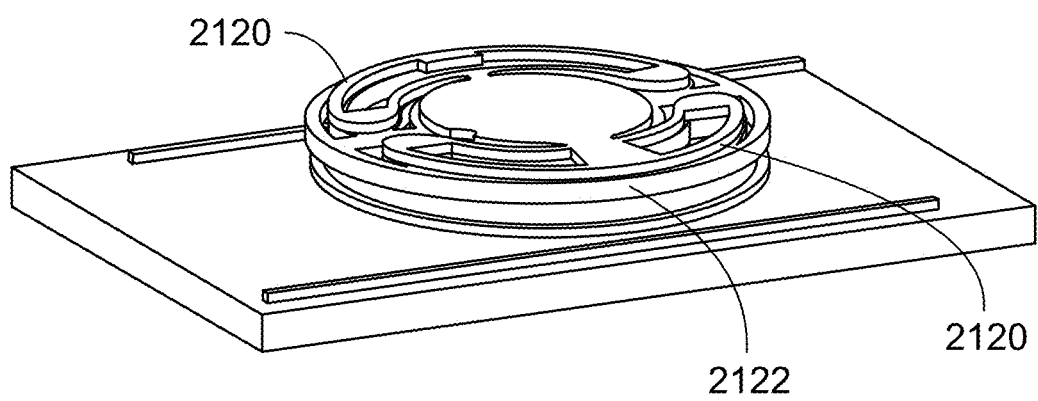
Figure 23:
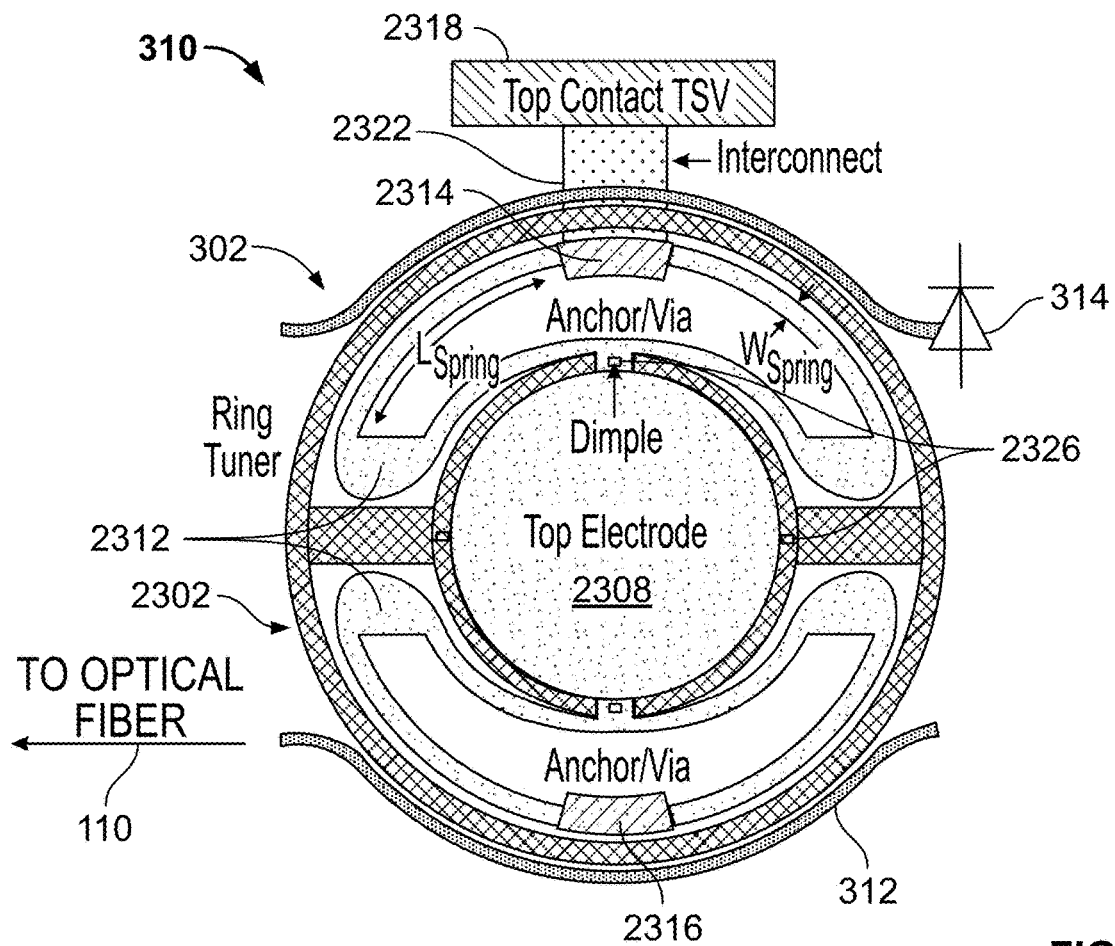
FIG. 23 is a top down view of a MEMS-tunable ring resonator in the transmit componentry of a photonics transceiver in accordance with one or more embodiments of the present invention.

FIG. 21A depicts a pair of springs 2100, for example, an exemplary instantiation of the spring 2010, wherein the springs 2100 have a folded spring design that provides strain relief due to film stress with relatively low curling. The springs 2100 are called external folded springs as the springs 2100 are located outside a tuner ring 2102. Note that while the illustrated folded springs 2100 employ linear segments, other instantiations (not illustrated) with folded springs may be formed of arced segments. While the springs 2100 illustrated in FIG. 21A are formed of linear segments folded back on themselves, in other instantiations (not illustrated), the springs may be a single linear segment or may include two or more linear segments with an angle therebetween, i.e., a "multi-linear segment spring." FIG. 21B depicts a spring 2110, for example, another exemplary instantiation of the spring 2010, wherein the spring 2110 has a cantilever spring design that provides various benefits. The benefits of this cantilever design include a lower spring constant, and thus a lower operating voltage for the same spring area, as well as eliminating one of the MEMS-waveguide crossings. Similar to the external folded springs 2100, the cantilever spring 2110 is located outside of a tuner ring 2112, though in other instantiations (not illustrated) the cantilever spring may be located within the tuner ring 2112. FIG. 21C depicts a pair of springs 2120, for example, yet another exemplary instantiation of the spring 2010, wherein the springs 2120 have a folded spring design that provides strain relief due to film stress with relatively low curling. The utilization of the springs 2120 results in a reduction in the areal footprint required for a MEMS-tunable optical ring resonator. The springs 2120 are called internal folded springs as the springs 2120 are located within a tuner ring 2122 (FIG. 23 illustrates similar internal folded springs 2312). While the springs 2120 illustrated in FIG. 21C are formed of arced segments folded back on themselves, in other instantiations (not illustrated), the springs 2120 may be a single linear segment spring or a multi-linear segment spring.

Figure 22:
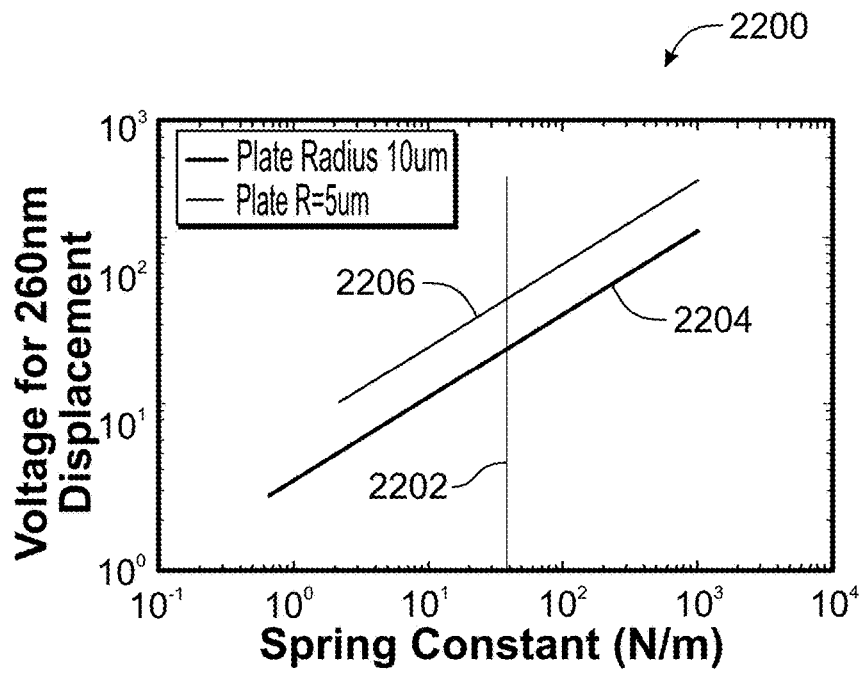
FIG. 22 is a plot that illustrates the voltage required to reach 260 nm displacement as a function of tuner spring constant for two different electrode overlap areas.

FIG. 22 is a plot 2200 that depicts the voltage required to reach 260 nm displacement, i.e., a tunable range corresponding to the full FSR of the optical ring resonator, as a function of the tuner spring constant based upon a model of the MEMS-tunable ring resonator. The plot 2200 includes a vertical line 2202 that indicates the necessary spring constant to achieve a 10 μN restoring force at 260 nm displacement. Curve 2204 represents the voltage required for a first exemplary design of the ring resonator 310, in which the entire inner area of the ring resonator 310 is used as an electrode with springs that are external to the rings of the ring resonator 310. Curve 2206 represents the voltage required for a second exemplary design of the ring resonator 310, when both springs and capacitive electrodes are enclosed within the ring (for a compact footprint). With respect to the first exemplary design, a tuning voltage of approximately 20V is required, while with respect to the second exemplary design, a tuning voltage of approximately 40V is required. With respect to the second exemplary design, a 42 N/m spring constant can be realized by 400 nm thick Au (100 nm)/SiO$_2$ (300 nm) folded springs with a length, $L_{spring}$ of 8 μm and a width of 2.5 μm. While a spring constant of 42 N/m was required for this instantiation, other instantiations may employ a spring constant between approximately 1 N/m and 100 N/m. Further, the required tuning voltage can be reduced through designs set forth in greater detail below. In other exemplary designs requiring different spring constants, the springs may have a thickness in the range of approximately 100 to 700 nm, a length of 6 to 10 μm, and a width of 0.5 to 5 μm. In certain instantiations, the optical ring resonator may not require tunability over a full FSR. Some system architectures may require tuning over just a fraction of the FSR, which may, for example, depend upon the difference between the longest and shortest operating wavelengths or upon the difference between two adjacent operating wavelengths, with the difference between two adjacent operating wavelengths preferably being the minimum tuning range.

Figure 24:
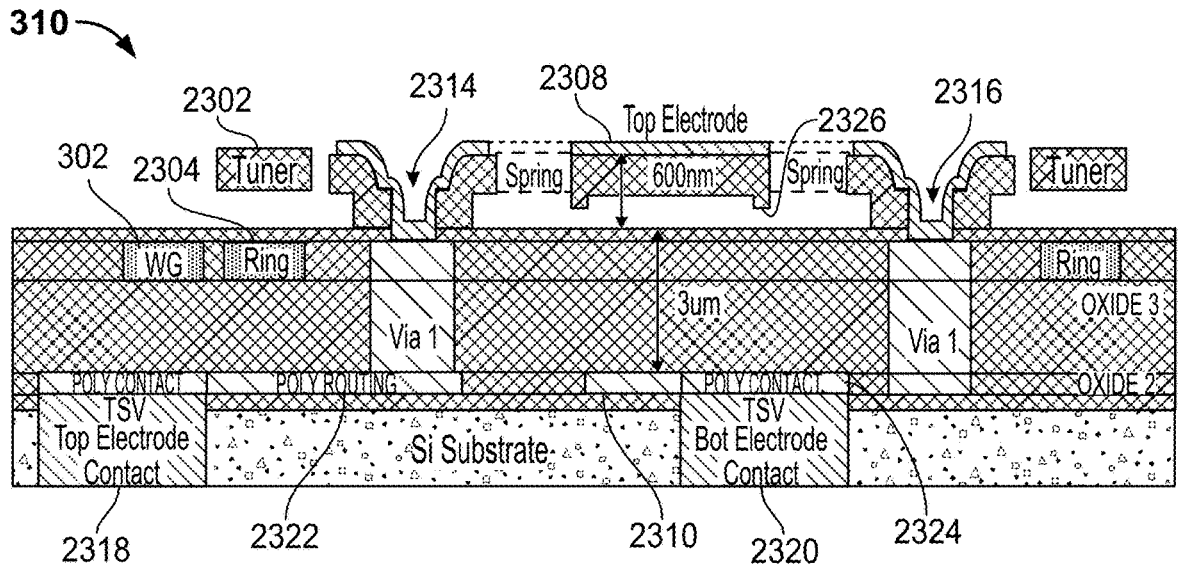
FIG. 24 is a cross-sectional view of an exemplary MEMS-tunable ring resonator in the transmit componentry of a photonics transceiver.

FIG. 23 depicts a top down view of the transmit ring resonator 310, and FIG. 24 depicts a cross-sectional view of the transmit ring resonator 310. The transmit ring resonator 310, in the example shown in FIGS. 23 and 24, includes a SiO$_2$ tuner ring 2302 and a Si$_3$N$_4$ resonator ring 2304 that is positioned directly below the tuner ring 2302, wherein heights of both the tuner ring 2302 and the resonator ring 2304 are approximately 300 nm. In other instantiations, the tuner ring 2302 may be formed of Si$_3$N$_4$, while the resonator ring 2304 may be formed of Si, Si$_3$N$_4$, Al$_2$O$_3$, LiNbO$_3$, or Ta$_2$O$_5$. As indicated previously, the tuner ring 2302 and the resonator ring 2304 can have a radius of approximately 10 μm. With respect to the transmit ring resonator 310, the transmit waveguide 302 can be a Si$_3$N$_4$ waveguide, which acts as a pulley coupler and preferably approximately critically couples to the resonator ring 2304. The transmit bus waveguide 312 is configured to receive light that has coupled into the transmit ring resonator 310 (light of the wavelength to which the transmit ring resonator 310 has been tuned) from the ring resonator 310, such that light from multiple ring resonators (of different wavelengths) is carried by the transmit bus waveguide 312 to the multicore optical fiber 110.

The transmit ring resonator 310 further includes a top electrode 2308 and a bottom electrode 2310 that is positioned directly beneath the top electrode 2308, with an initial gap of approximately 1.125 μm therebetween. While the instantiation illustrated in FIG. 24 includes a buried bottom electrode 2310, other instantiations may include a doped Si substrate with a backside metal contact; this combination forming an alternative bottom electrode. Voltage applied between the top and bottom electrodes 2308 and 2310 pulls the tuner ring 2302 towards the resonator ring 2304, thereby allowing the transmit ring resonator 310 to be tuned to a desired wavelength (which matches a corresponding laser channel). The transmit ring resonator 310 further comprises two internal folded springs 2312 (internal to the resonator ring 2304 and the tuner ring 2302), which are designed to have a desired spring constant (e.g., 42 N/m).

Electrical accesses to the transmit ring resonator 310 are by way of anchor/vias 2314 and 2316, and TSVs 2318 and 2320, wherein the anchor/vias 2314 and 2316 can be filled with doped polysilicon. The anchors/vias 2314 and 2316 are electrically coupled to the TSVs 2318 and 2320 by way of respective doped polysilicon routing 2322 and 2324. The doped polysilicon filing in the anchor/vias 2314 and 2316 can serve as an anchor for the tuner ring 2302, an electrical via, and a sacrificial layer for release of the MEMS tuner under dry etching. The anchor/via functionality is maintained by protecting the anchor/vias 2314 and 2316 with SiO$_2$ and top-side Au prior to release. The size of the electrode gap can be tailored based upon tuner ring 2302 thickness, tuning voltage, and dielectric constant of non-air material between the top electrode 2308 and the bottom electrode 2310. Four 40 nm thick contact dimples 2326 are etched into the sacrificial polysilicon (located beneath the top electrode 2308) to prevent stiction in the event that the pair of springs 2312 pull-in. While the dimples 2326 illustrated in FIGS. 23 and 24 are adjacent the top electrode 2308, in other examples the dimples are adjacent the bottom electrode 2310. The transmit ring resonator 310 can further optionally include a low stiction contact material, such as sputtered Ruthenium, deposited on and/or below the dimples 2326.

In other exemplary embodiments, an electrical contact can be placed on the topside of the transmit ring resonator 310 for flexibility. This topside electrical contact may include air bridges over one or more features, for example, the tuner ring 2302, the transmit waveguide 302, and/or the transmit bus waveguide 312. The monitor photodiode 314 is coupled to the waveguide 302, as described above, wherein the monitor photodiode 314 is on-chip with the ring resonator 310, as illustrated in FIG. 3. Accordingly, in an exemplary embodiment, every transmit ring resonator in the Tx componentry can be paired with a corresponding monitor photodiode whose output can be analyzed to monitor tuning of the corresponding transmit ring resonator.

In an exemplary embodiment, the tuning voltage for the transmit ring resonator 310 may be approximately 40 V. In another exemplary embodiment, the tuning voltage may be approximately 20 V or less. This relatively low tuning voltage can be accomplished by, for example, using various alternative configurations. For example, a MEMS-tunable ring resonator employing a cantilever design in accordance with FIG. 21B with a 10 μm radius demonstrated tunability over more than its FSR with a voltage of less than 15 V. As another example, an exemplary embodiment uses vertical comb drives, which employ control voltages in the 6 V range. Another exemplary embodiment uses relatively low spring constant structures enabled by low stiction dimples and contact materials. Yet another exemplary embodiment uses resonant switches that take advantage of the switch quality factor and DC bias amplification. A further exemplary embodiment uses a less confined, lower index contrast structures such as relatively thin waveguides and ridge-waveguides. A still further exemplary embodiment uses a relatively small resonator ring 2304 radius to increase optical field overlap with the tuner ring 2302. In contrast to previous demonstrations of optical MEMS tuning of integrated optics, the transmit ring resonator 310 depicted in FIGS. 23 and 24 leads to better scalability to larger aggregate bit rates, while the low insertion loss, cross-talk, and low power are advantages over non-MEMS approaches.

The use of a tuner ring 2302 that moves in a direction normal to the plane formed by the resonator ring 2304, especially one in which the springs 2312 are directly coupled to the tuner ring 2302, contrasts with various prior art MEMS-tunable ring resonators. For example, Haffner, et al., discloses a MEMS-tunable ring resonator that employs a gold disk-shaped membrane suspended over a fixed resonator ring via a fixed pedestal located in the middle of the resonator ring. Haffner, et al., "Nano-opto-electro-mechanical switches operated at CMOS-level voltages," Science, Vol. 366, November 2019, pages 860-864, the entirety of which is incorporated herein by reference. Nielson, et al., discloses a MEMS-tunable ring resonator that employs an aluminum rectangular-shaped membrane suspended over a fixed resonator ring via fixed risers at both long ends of the rectangular-shaped membrane, with the risers being located outside of the resonator ring. Nielson, et al., "Integrated Wavelength-Selective Optical MEMS Switching Using Ring Resonator Filters," IEEE Photonics Technology Letters, Vol. 17, No. 6, June 2005, pages 1190-1192, the entirety of which is incorporated herein by reference. Abdulla, et al., discloses a MEMS-tunable ring resonator that employs a gold coated dielectric rectangular-shaped membrane suspended over a fixed resonator ring via a fixed riser at one of the long ends of the rectangular-shaped membrane, with the riser being located outside of the resonator ring. Abdulla, et al., "Tuning a racetrack ring resonator by an integrated dielectric MEMS cantilever," Optics Express, Vol. 19, No. 17, August 2011, pages 15864-15878, the entirety of which is incorporated herein by reference.

Figure 25:
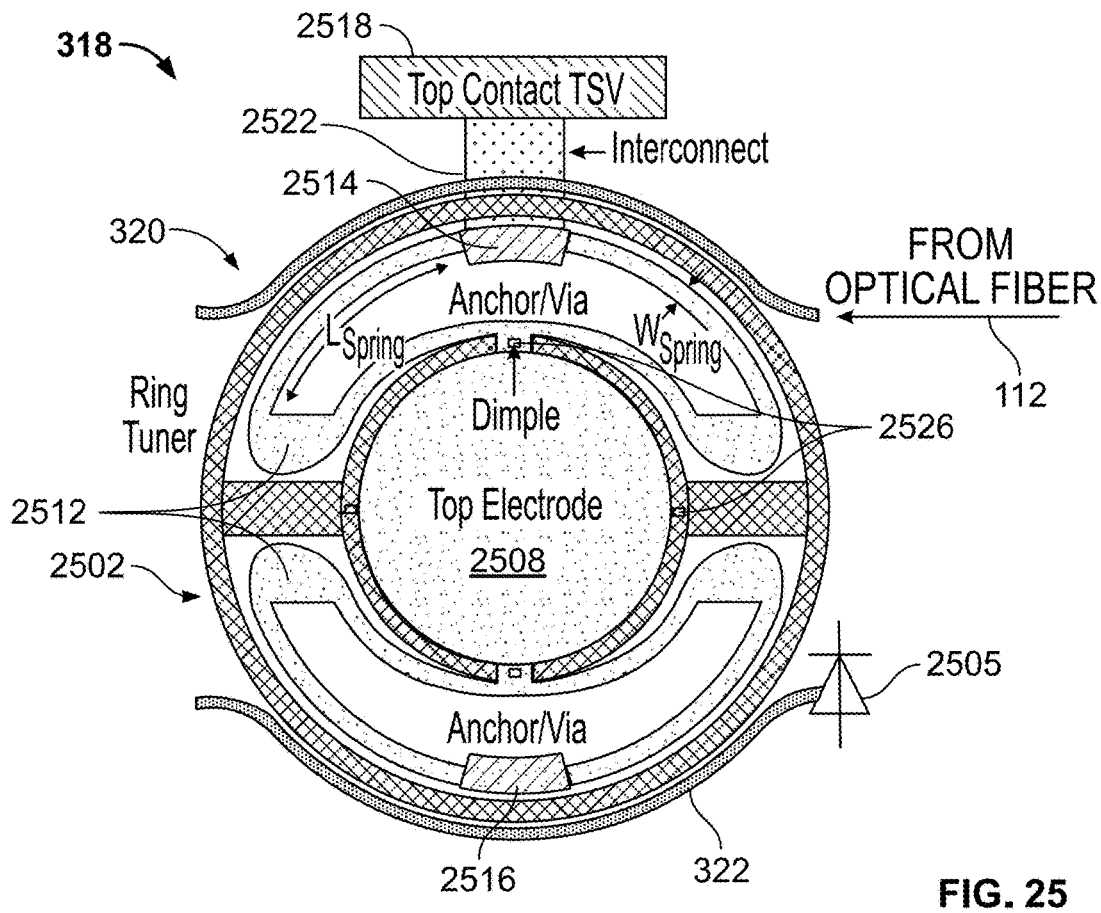
FIG. 25 is a top down view of a MEMS-tunable ring resonator in the receive componentry of a photonics transceiver in accordance with one or more embodiments of the present invention.
Figure 26:
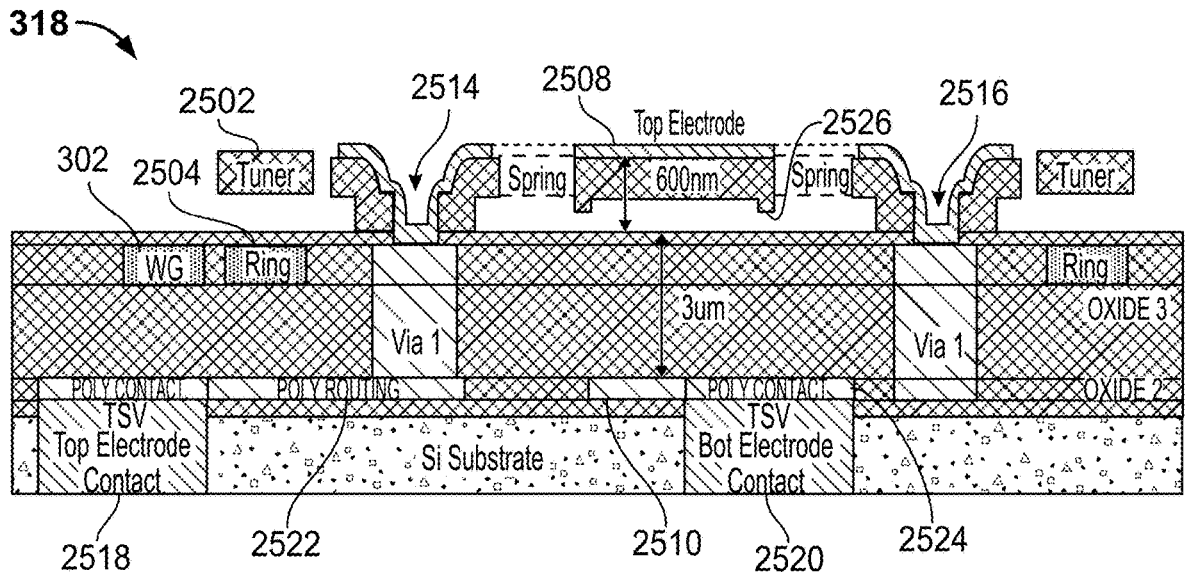
FIG. 26 is a cross-sectional view of a MEMS-tunable ring resonator in the receive componentry of a photonics transceiver in accordance with one or more embodiments of the present invention.

FIG. 25 is a top down view of the receive ring resonator 318 and FIG. 26 is a cross-sectional view of the receive ring resonator 318. The receive ring resonator 318, like the receive ring resonator 310, includes a $SiO_2$ tuner ring 2502 and a $Si_3N_4$ resonator ring 2504 that is positioned directly below the tuner ring 2502, wherein heights of both the tuner ring 2502 and the resonator ring 2504 are approximately 300 nm. In other instantiations, the tuner ring 2502 may be formed of $Si_3N_4$, while the resonator ring 2504 may be formed of Si, $Si_3N_4$, $Al_2O_3$, $LiNbO_3$, or $Ta_2O_5$. The tuner ring 2502 and the resonator ring 2504 can have a radius of approximately 10 μm. With respect to the receive ring resonator 318, the receive bus waveguide 320 can carry 8 optical channels (received from the multicore optical fiber 112), wherein each channel is associated with a different wavelength. The receive ring resonator 318 is tuned to one of the aforementioned wavelengths, such that light of the desired wavelength couples from the receive bus waveguide 320 into the resonator ring 2504. The receive waveguide 322 can be a $Si_3N_4$ waveguide, which is optically coupled to the resonator ring 2504 and receives light of the desired wavelength. A photodetector 2505 on the PD chip 106 is optically coupled to the receive waveguide 322, and outputs an electrical signal based upon the light that is coupled into the receive waveguide 322 from the resonator ring 2504.

The receive ring resonator 318 further includes a top electrode 2508 and a bottom electrode 2510 that is positioned directly beneath the top electrode 2508, with an initial gap of approximately 1.125 μm therebetween. While the instantiation illustrated in FIG. 26 includes a buried bottom electrode 2510, other instantiations may include a doped Si substrate with a backside metal contact; this combination forming an alternative bottom electrode. As with the transmit ring resonator 310, voltage applied between the top and bottom electrodes 2508 and 2510 pulls the tuner ring 2502 towards the resonator ring 2504, thereby allowing the ring resonator 318 to be tuned to a desired wavelength (which matches a channel on the multicore optical fiber 112). The receive ring resonator 318 further comprises a pair of springs 2512 that are designed to have a desired spring constant (e.g., 42 N/m). When viewed from above (FIG. 25), the springs 2512 are internal to the resonator ring 2504 and the tuner ring 2502.

The receive ring resonator 318 includes anchor/vias 2514 and 2516, and TSVs 2518 and 2520, wherein the anchor/vias 2514 and 2516 can be filled with doped polysilicon. The anchors/vias 2514 and 2516 are electrically coupled to the TSVs 2518 and 2520 by way of respective doped polysilicon routing 2522 and 2524. The doped polysilicon filing in the anchor/vias 2514 and 2516 can serve as an anchor for the tuner ring 2502, an electrical via, and a sacrificial layer for release of the MEMS tuner under dry etching. The anchor/via functionality is maintained by protecting the anchors/vias 2514 and 2516 with $SiO_2$ and top-side Au prior to release. The size of the electrode gap can be tailored based upon tuner ring 2502 thickness, tuning voltage, and dielectric constant of non-air material between the top electrode 2508 and the bottom electrode 2510. Four 40 nm thick contact dimples 2526 are etched into sacrificial polysilicon (located beneath the top electrode 2508) to prevent stiction in the event that the springs 2512 pull-in. While the dimples 2526 illustrated in FIGS. 25 and 26 are adjacent the top electrode 2508, in other examples the dimples are adjacent the bottom electrode 2510. The ring resonator 318 can further optionally include a low stiction contact material, such as sputtered Ruthenium, deposited on and/or below the dimples 2526.

In other exemplary embodiments, an electrical contact can be placed on the topside of the ring resonator 318 for flexibility. This topside electrical contact may include air bridges over one or more features, for example, the tuner ring 2502, the receive waveguide 322, and/or the receive bus waveguide 320. Further, in an exemplary embodiment, every ring resonator in the Rx componentry is paired with a photodiode from the PD chip 106, such that there is a 1:1 correspondence between ring resonators and photodiodes.

In an exemplary embodiment, the tuning voltage for the ring resonator 318 may be approximately 70 V. In another exemplary embodiment, the tuning voltage may be approximately 20 V or less. This relatively low tuning voltage can be accomplished by, for example, using various alternative configurations. For example, a MEMS-tunable ring resonator employing a cantilever design in accordance with FIG. 21B with a 10 μm radius demonstrated tunability over more than its FSR with a voltage of less than 15 V. As another example, an exemplary embodiment uses vertical comb drives, which employ control voltages in the 6 V range. Another exemplary embodiment uses relatively low spring constant structures enabled by low stiction dimples and contact materials. Yet another exemplary embodiment uses resonant switches that take advantage of the switch quality factor and DC bias amplification. A further exemplary embodiment uses a less confined, lower index contrast structures such as relatively thin waveguides and ridge-waveguides. A still further exemplary embodiment uses a relatively small resonator ring 2504 radius to increase optical field overlap with the tuner ring 2502.

Figure 27:
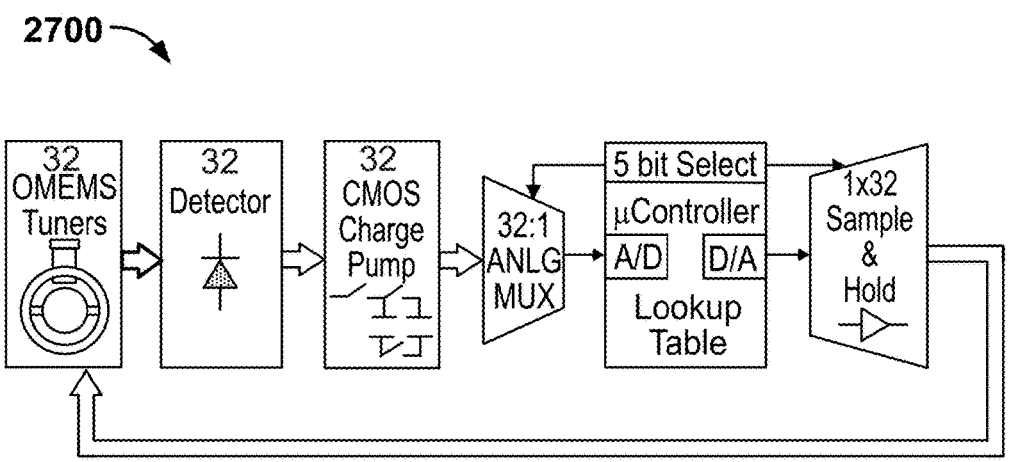
FIG. 27 is a schematic that depicts a feedback control loop for several MEMS-tunable ring resonators in accordance with one or more embodiments of the present invention.

FIG. 27 depicts an exemplary feedback circuit 2700 for simultaneously controlling a set of ring resonators in the Tx componentry (including the ring resonator 310) or the Rx componentry (including the ring resonator 318). The feedback circuit 2700 can include low-speed low-power commercial off-the-shelf electronics or can be included in custom CMOS control/logic circuits. In an example, the feedback circuit 2700 can be included on the PCB 402 and can be routed to the set of ring resonators through the control/logic chip 102, which can incorporate feedthrough routing and pads that are designed for the set of ring resonators.

Figure 28:
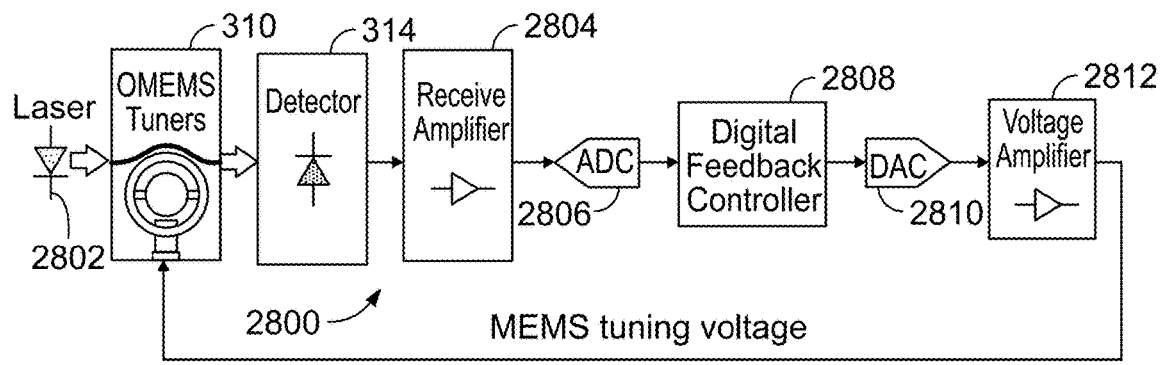
FIGS. 28 and 29 depict exemplary circuits that can be employed to control a MEMS-tunable optical ring resonator in accordance with one or more embodiments of the present invention.

FIG. 28 is a schematic of an exemplary circuit 2800 that can be employed to control a set of transmit ring resonators 310 and/or a set of receive ring resonator 318. For ease of explanation, the discussion below is made with respect to the circuit 2800 being employed to control the set of transmit ring resonators 310. It is to be understood, however, that the circuit 2800 can also be configured to control the set of receive ring resonators 318. The circuit 2800 can be configured to lock the resonant wavelength of each of the transmit ring resonators 310 to a corresponding desired wavelength (e.g., light output by a laser 2802) by altering the distance between the tuner ring 2302 and the resonator ring 2304. The monitor photodetector 314 detects light that has passed the ring resonator 310, i.e., that was not coupled to the resonator ring 2304. The circuit 2800 comprises a receiver amplifier 2804 that converts photocurrent output by the monitor photodetector 314 to a voltage. In an exemplary embodiment, the receiver amplifier 2804 can be a transimpedance amplifier or a CMOS charge pump, depending upon the desired power consumption, sensitivity, and bandwidth. An analog-to-digital converter (ADC) 2806 is electrically coupled to the receiver amplifier 2804, and a digital feedback controller 2808 is electrically coupled to the output of the ADC 2806. The controller 2808 can be a microcontroller, a field programmable gate array (FPGA), etc. The controller 2808 is programmed to determine a wavelength offset and output a necessary voltage to a digital-to-analog converter (DAC) 2810. The circuit 2800 further includes a voltage amplifier 2812 that is electrically coupled to the output of the DAC 2810, wherein the voltage amplifier 2812 is configured to amplify a voltage output by the DAC 2810 and direct the voltage to the control terminal of the transmit ring resonator 310.

The controller 2808 can include a look-up table that is usable to identify a new voltage based upon the voltage output by the ADC 2806 and a previous voltage. Further, the controller 2808 can include a proportional, integral, and derivative gain (PID) control algorithm or a PID chip. It can be noted that in the transmit mode, wavelength locking can be obtained by minimizing the signal from the monitor photodetector 314. In another exemplary embodiment, when the circuit 2800 is employed to tune the receive ring resonator 318, the circuit 2800 includes the photodetector 2505 (FIG. 25) rather than the monitor photodetector 314. In such an embodiment, wavelength locking is obtained by maximizing the signal from the photodetector 2505.

Figure 29:
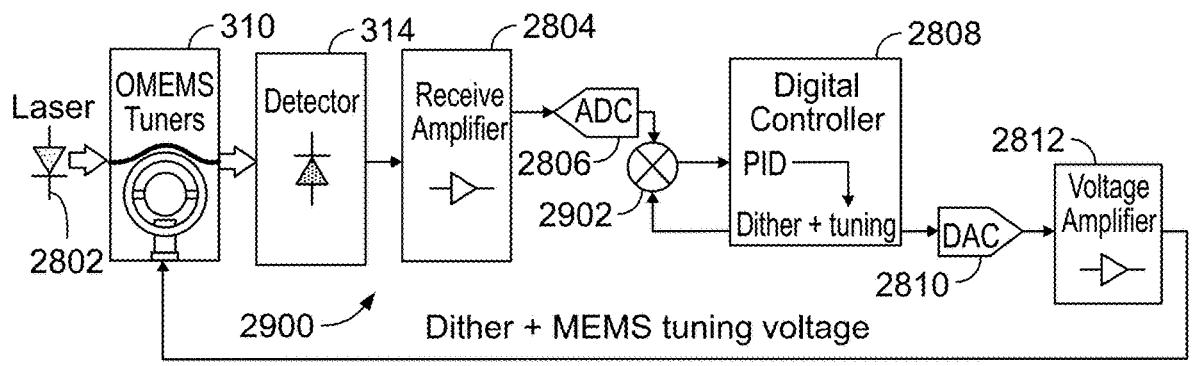

The tuning algorithm can include a simple lookup table, dither and lock technique, Pound-Drever-Hall locking or a Sigma-Delta locking technique for precise control. Since the detected photocurrent is the same both slightly above and below resonance, the slope of the detected signal versus time are used in addition to amplitude. FIG. 29 depicts an exemplary circuit 2900 that includes locking electronics for a dither and lock technique. In the exemplary circuit 2900, the control voltage applied to the control terminal of the transmit ring resonator 310 (or the receive ring resonator 318) includes a rapidly varying dither between a high and low voltage, plus a slowly varying tuning voltage offset. By dithering the tuning voltage, the slope of the received signal can be determined in addition to the magnitude. The dither plus the tuning voltage can be multiplied (by a multiplier 2902) with the received photocurrent to generate an error signal, which is on average zero exactly on-resonance and non-zero off-resonance. The digital controller 2808 determines the average and determines a new tuning setpoint using a PID circuit.

To control a set of optical ring resonators, analog multiplexers can be utilized preceding the ADC 2806 and an analog demultiplexer can follow the DAC 2810. It can be noted existing chip manufacturers manufacture a sample and hold array that combines the functionality of an analog demultiplexer and voltage amplifier. Li, et al., "A 25 Gb/s, 4.4 V-Swing, AC-Coupled Ring Modulator-Based WDM Transmitter With Wavelength Stabilization in 65 nm CMOS," IEEE Journal of Solid-State Circuits, Vol. 50, No. 12, December, 2015, pages 3145-3159 describes a hybrid integrated ring based WDM transceiver that can be utilized in applications such as 100G Ethernet, and further discloses a wavelength stabilization circuit that is configured to control a heater in connection with locking a resonant wavelength of a resonator to a desired wavelength. A similar circuit can be employed in connection with controlling the voltage applied to a control terminal of the transmit ring resonator 310 and/or the receive ring resonator 318. The entirety of such paper is incorporated herein by reference.

Figure 30:
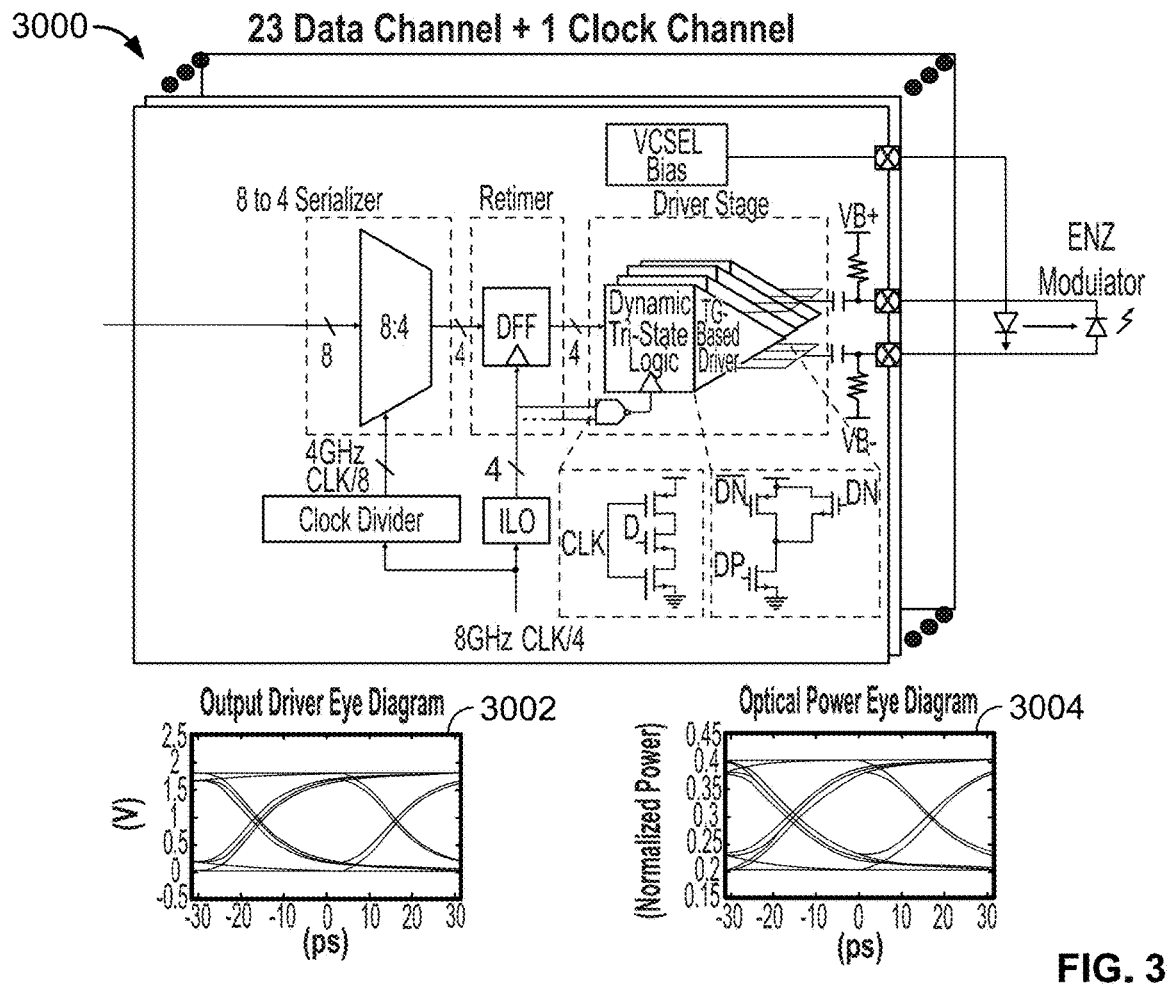
FIG. 30 is a schematic that depicts a 32 Gb/s optical transmitter architecture in accordance with one or more embodiments of the present invention with simulated eye diagrams of modulator driver output voltage and modulator normalized optical output power.

FIG. 30 depicts an exemplary optical transmitter architecture 3000 with simulated eye diagrams of the modulator driver output voltage and the modulator normalized optical output power. The optical interconnect system of the photonics transceiver 100 can be architected such that the optical I/O serializer/deserializer (SerDes) circuitry is on the same die as the control/logic chip 102. The control/logic chip 102 can be efficiently connected to the PIC chip 108 by way of high density, low capacitance flip-chip bonding.

The transmit electronics in the control/logic chip 102, in an exemplary embodiment, operate with a non-return-to-zero (NRZ) PAM-2 modulation and perform an 8:1 SerDes operation to interface with parallel data clocked at rates ranging from 2.875 GHz to 5 GHz core frequencies when the output combined serialized data rate varies from 23 Gb/s to 32 Gb/s. Two techniques are employed to achieve low optical transmitter power consumption. The first technique involves saving significant clocking power by utilizing a quarter-rate architecture with the fastest clocks being the serial data divided by four. The 4:1 final serialization is done directly at the modulator with four parallel output stages driven by low-power dynamic logic. The second technique involves providing an efficient means to scale the output driver swing from 100 mV to 1.8 V across the two modular terminals via a transmission-gate style differential output driver, as shown in the 32 Gb/s eye diagrams 3002 and 3004 of FIG. 30. Simulations have shown that this allows an extinction ratio near 6 dB.

The clocks that synchronize the transmitter serialization originate from a global 8 GHz phase-locked loop (PLL) whose differential output clock is distributed to a bank of 24 channels. An injection-locked oscillator (ILO) at each transmit channel efficiently generates the four quarter-rate clock phases used in the output multiplexing transmitter. A forward-clock architecture, where an additional transmit clock channel forwards a quarter-rate clock pattern to the receiver-side, is utilized to save receive side clocking circuitry complexity. This is arranged in groups of 24, with 23 data channels sharing one clock channel.

Information related to the receive architecture of the photonics transceiver 100 is now set forth. One aspect of the photonic transceiver 100 is compact integration with the control/logic electronics to minimize input capacitance to the fF-level. To achieve such small photodiode capacitance, the PD chip 106 can be directly flip-chip bonded to the control/logic chip 102 and adjacent to the PIC chip 108.

Figure 31:
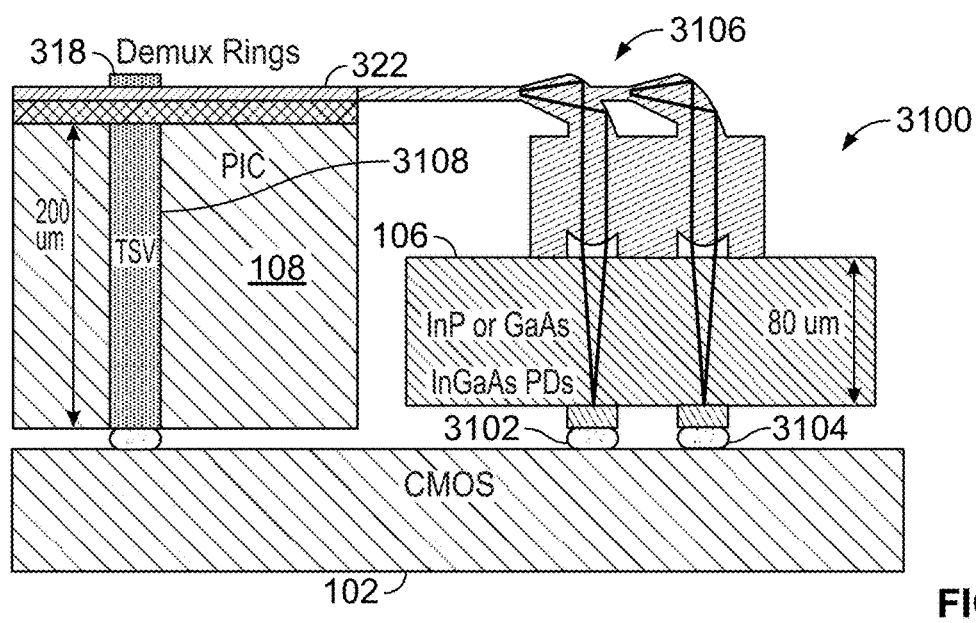
FIG. 31 is a cross-sectional side view of the outputs of two adjacent waveguides coupling into two bottom-illuminated photodiodes in accordance with one or more embodiments of the present invention.

FIG. 31 is a cross-sectional view of a portion 3100 of the photonics transceiver 100. The portion 3100 includes the PD chip 106 flip-chip bonded to the control/logic chip 102. The PID chip 106 includes two bottom-illuminated PDs 3102 and 3104. Inputs of the PDs 3102 and 3104 are optically coupled to silicon nitride ($Si_3N_4$) waveguides (e.g., including the receive waveguide 322) on the PIC chip 108 by way of the set of micro-optics 3106 that include the set of micro-optics 206. The set of micro-optics 3106, for example, can be 3D printed utilizing a suitable tool. The PIC chip 108 includes a TSV 3108 (shown as being 200 μm in depth), wherein receive ring resonators (including the receive ring resonator 318) are electrically coupled to circuitry of the control/logic chip 102 by way of TSVs that include the TSV 3108. In other embodiments, the set of micro-optics may take the form illustrated in FIGS. 13A-13B or 14A-14B, as described above.

Figure 32:
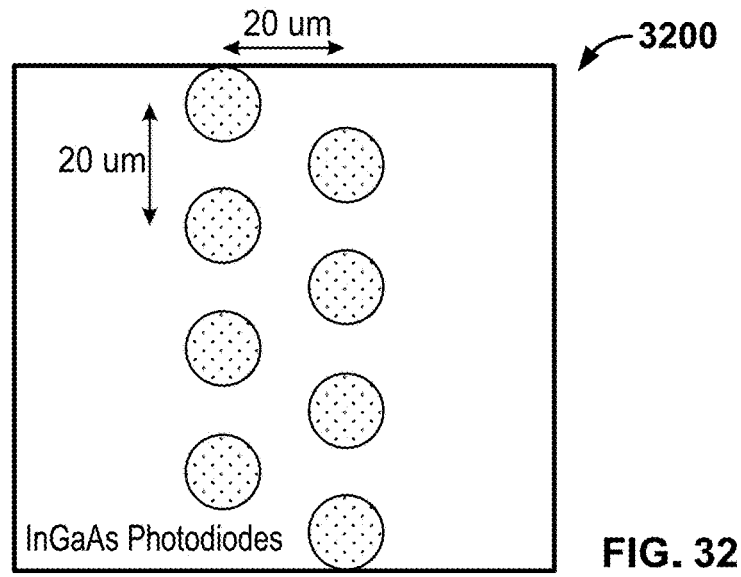
FIG. 32 is a schematic plan view of an eight-element array of photodiodes in accordance with one or more embodiments of the present invention.

The set of micro-optics 3106 can be 3D printed or molded micro-optics that optically connect from the PIC chip waveguides on a 10 μm pitch to a 2D array of InGaAs photodiodes (on the PD chip 106) on a 20 μm pitch. In an exemplary embodiment, an array of bottom-illuminated InGaAs photodiodes can be lattice matched on an InP substrate when fabricating the photodiodes as part of the PD chip 106. Because the band edge of InP occurs at 930 nm, prohibitively high absorption of 980 nm light within the InP substrate is not expected. In another exemplary embodiment, InGaAs photodiodes can be grown on a GaAs substrate in order to move the absorbing band edge from 930 nm (InP) to 870 nm (GaAs) to assure lower attenuation in the substrate at a wide range of ambient temperature conditions. Because the InGaAs absorbing layer is not lattice-matched to the GaAs substrates, metamorphic InGaAs detectors are developed on GaAs substrates. It is noted that InGaAs photodiodes with capacitance values of 500 fF for a photodiode diameter of 60 μm have been achieved. In an exemplary embodiment, the diameter of the InGaAs photodiodes on the PD chip 106 can be on the order of 12 μm, thereby reducing the photodiode capacitance to 20 fF. FIG. 32 depicts an array 3200 of InGaAs photodiodes having diameters of approximately 12 μm arranged on a substrate with a 20 μm pitch, such as might be incorporated in PD chip 106.

Figure 33:
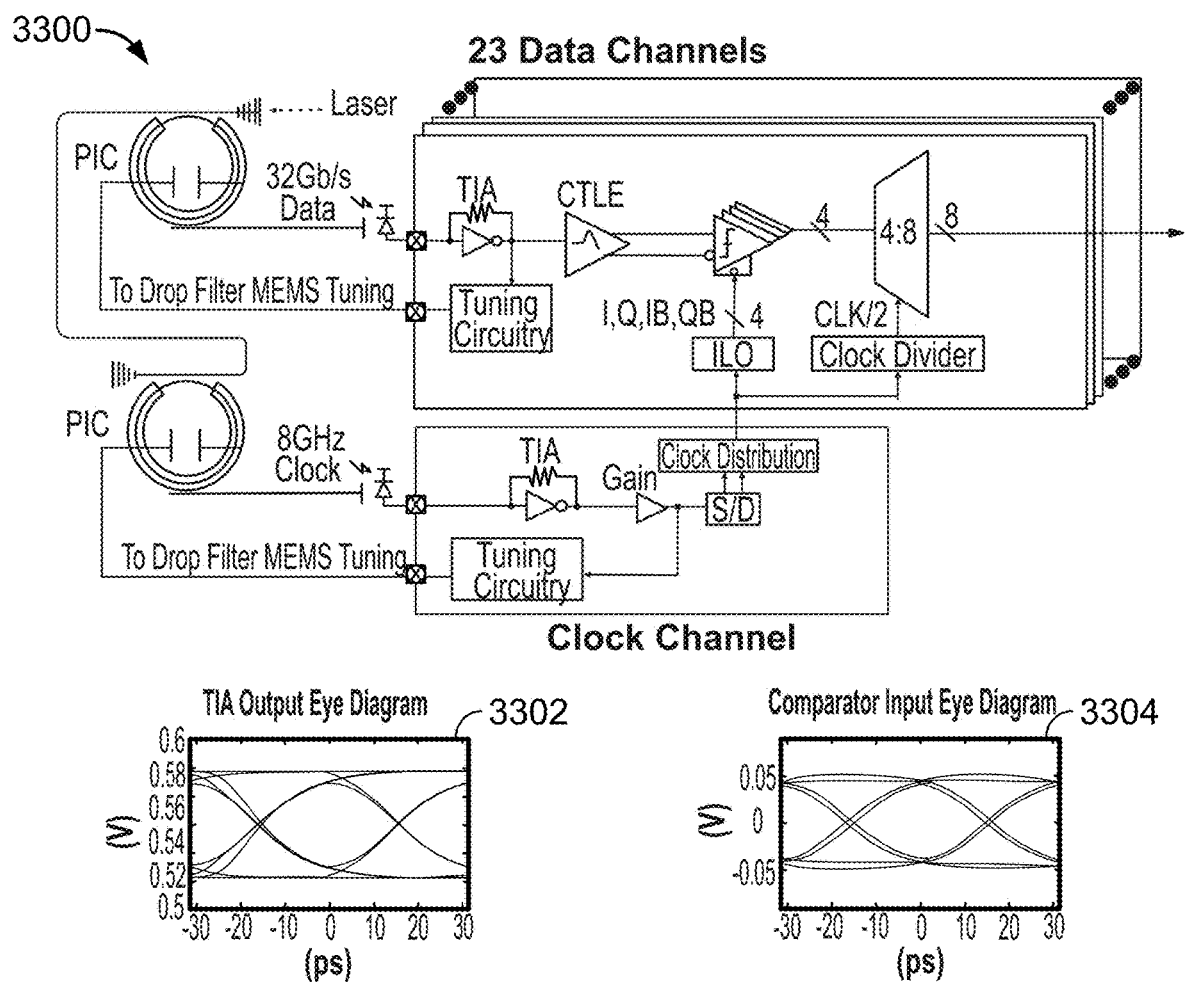
FIG. 33 is a schematic that depicts a 32 Gb/s optical receiver architecture in accordance with one or more embodiments of the present invention with simulated eye diagrams at different points within the optical receiver.

FIG. 33 illustrates exemplary receive electronics 3300 that can be included in the control/logic chip 102, and further illustrates eye diagrams 3302 and 3304 that correspond to the electronics 3300. The PIC chip 108 performs a 1:8 demultiplexing operation to provide 8 parallel data bits off-chip, wherein the output serialized data rate can be between 23 Gb/s and 32 Gb/s (in an exemplary embodiment). The first technique that saves both receiver and overall link power is utilizing high-density, low-capacitance flip-chip bonding to connect the photodetectors on the PD chip 106 to the receiver transimpedance amplifier (TIA) front-end in order to improve receiver sensitivity. This allows for a reduction in the total TIA input capacitance, $C_T$, to near 20 fF. Given that the TIA input-referred current noise power spectral density is expressed as:

$$I_{n,TIA}^2(f) = \frac{fkT}{R_F} + \frac{4kT\Gamma}{g_m R_F^2}[1+(2\pi C_T R_F)^2 f^2], \quad \text{(Eq. 3)}$$

reducing $C_T$ provides significant noise reduction. This small $C_T$ also allows for increased TIA feedback resistance, RF, for a given bandwidth.

The second technique that saves power involves following the TIA front end with a continuous-time linear equalizer (CTLE) block that provides frequency peaking. This allows for reduced TIA input bandwidth for lower noise, while still maintaining sufficient overall bandwidth for a high-quality 32 Gb/s eye diagram 3002 (shown in FIG. 33) at the 4 parallel comparators that perform conversion to full CMOS levels and the initial 1:4 demultiplexing operation. Relative to a previous demonstration of a similar architecture operating at 25 Gb/s in a 65 nm CMOS technology, this design utilizes a low-voltage inverter-based CTLE for reduced power and area.

The third power-saving technique is the clocking architecture for receiver-side data retiming and deserialization. Considerations include achieving efficient receiver-side clock generation and sufficient jitter tracking of the incoming data to achieve the desired BER. The photonics transceiver 100 can utilize a forwarded clock architecture, implemented with a transmitted clock pattern over an additional wavelength that is shared by 23 data channels, to provide improved high-frequency jitter tolerance without any additional clock-and-data recovery (CDR) phase detectors. An ILO at each receiver channel serves the dual purpose of generating the four clock phases for data demultiplexing and providing a programmable phase shift for timing margin optimization through tuning of the free-running frequency.

While additional monitor photodetectors are utilized in the Tx componentry to provide information for tuning the ring resonators in the Tx componentry, in the Rx componentry only the main (high-speed) photodetectors are required to extract tuning information. A peak detector circuit ("Tuning Circuitry") placed at the transimpedance amplifier output is utilized to maximize the peak power to allow for operation with the receiver's offset correction loop, as shown in FIG. 33.

Figure 34:
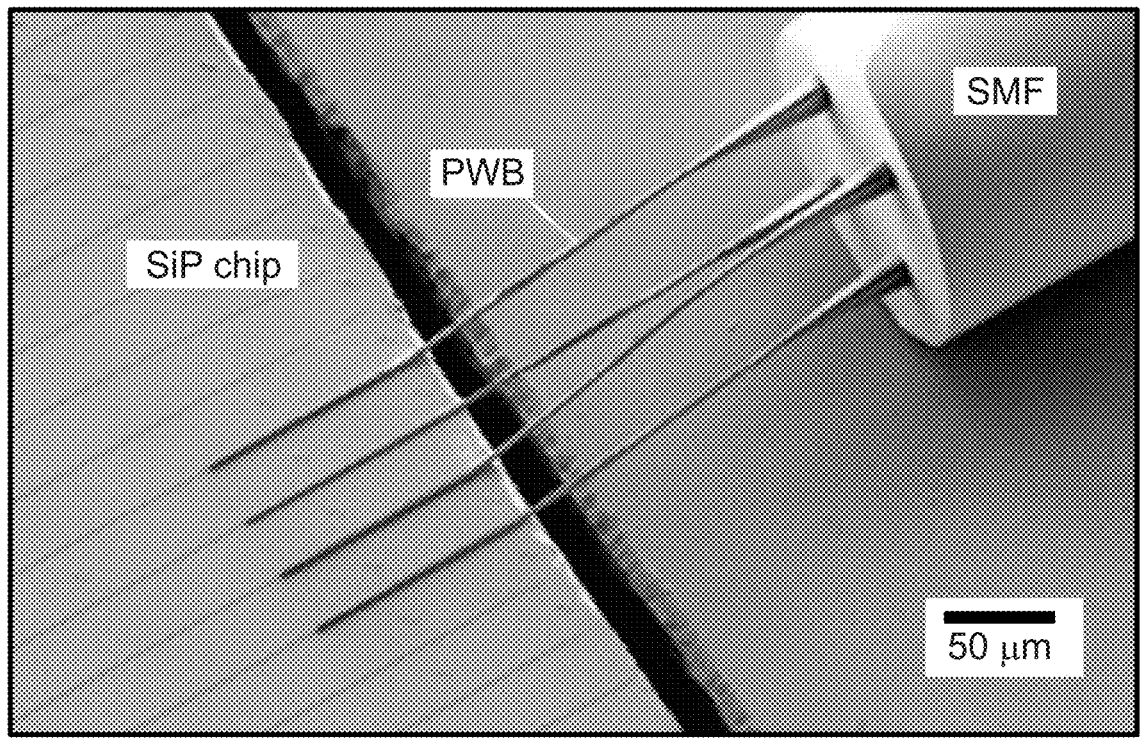
FIG. 34 is an image of exemplary prior art photonic wire bonds between a multicore fiber and a silicon photonics chip that may be used in accordance with one or more embodiments of the present invention.

To provide optical connections between VCESLs on the VCSEL chip 104 and transmit waveguides on the PIC chip 108, and to provide optical connections between the receive waveguides of the PIC chip 108 and photodetectors on the PD chip 106, a set of micro-optics, in the form of photonic wire bonding (PWB), can be employed. PWBs are fabricated using a direct laser writing technique (multiphoton lithography (MPL)) that enables free-form fabrication of arbitrary 3D geometries/trajectories with approximately 100 nm feature sizes. Solvent-free photoresists are chemically inert and enable dip-in writing of a high NA focusing objective for a near-end fabrication step of chip-to-chip bonding. The technique has been applied to wire multi- and single-mode interconnects from edge and surface emitting lasers to silicon chips with both planar and vertical-to-horizontal connections as is shown in FIG. 34. Billah, et al., "Hybrid integration of silicon photonics circuits and InP lasers by photonic wire bonding," Optica, Vol. 5, No. 7, July, 2018, pages 876-883, the entirety of which is incorporated herein by reference. The single-mode connections can use flared end tapers to accommodate NA mismatch between the VCSEL chip 104/PIC chip 108 and PIC chip 108/PD chip 106 input/outputs. The bottom-emitting/bottom-illuminating design for the III-V VCSEL chip 104 and PD chip 106 will also require patterning micro-lenses and total-internal-reflection mirrors in the same platform, as shown in FIGS. 12 and 31.

These cured materials (low metal containing polyacrylates with high cured modulus, 1-2 GPa) range in index from approximately 1.49 to 1.54 (at a wavelength of 850 nm) and can be backfilled with low index oil (noji) to test coupling losses. Connections can be finalized using an index-matched cladding material such as an optical adhesive. A recent demonstration has shown coupling losses from non-planar InP VCSELs to SiP/waveguides of 0.4-1.3 dB using PWBs, which is suitable performance for the architecture described herein. The success of this approach, however, assumes line of sight access with relatively small working distance (<1 µmm) and requires highly accurate chip to chip placement or high resolution, 3D vision-learning to determine free-form 3D trajectories.

Figure 35:
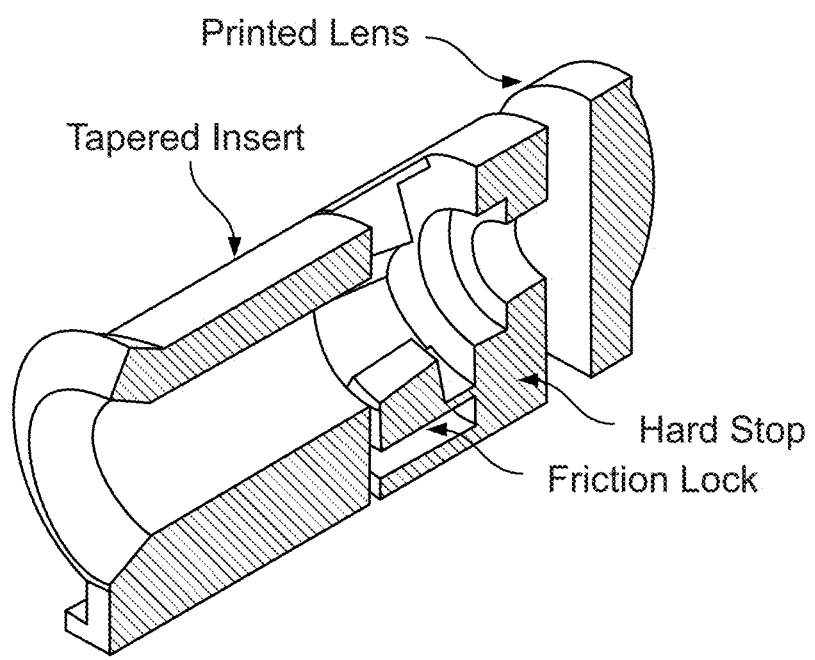
FIG. 35 illustrates an exemplary self-aligning fiber connector integrated into a lens assembly in accordance with one or more embodiments of the present invention.
Figure 36:
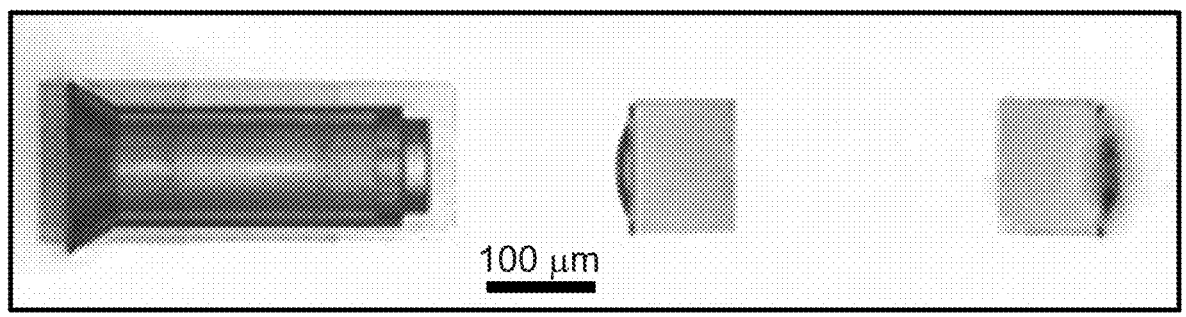
FIG. 36 depicts an exemplary printed fiber insert and lens pair in accordance with one or more embodiments of the present invention.
Figure 37:
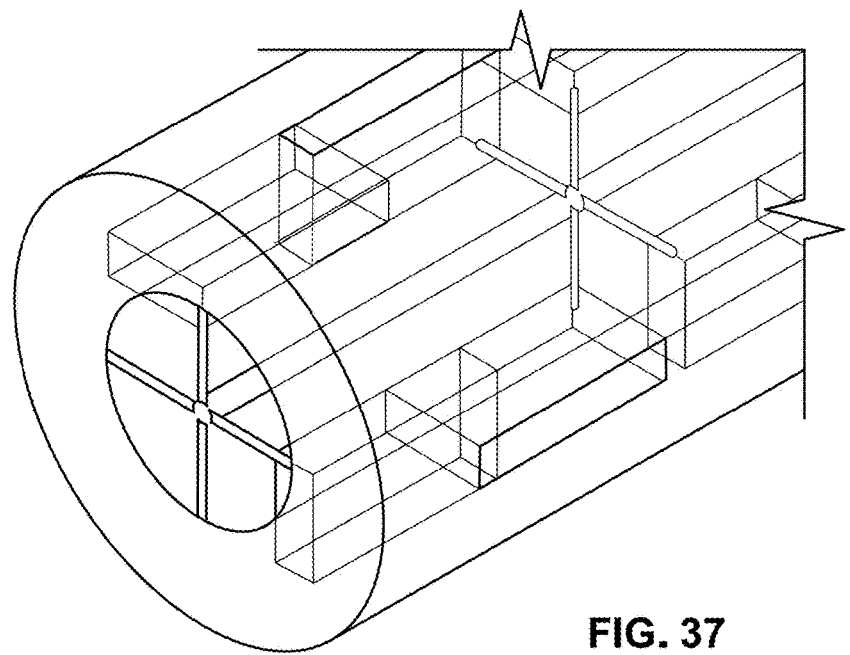
FIG. 37 is a schematic that depicts a reinforced single mode waveguide in accordance with one or more embodiments of the present invention.

Monolithic 3D components can be batch-printed separately to allow for flexibility in assembly and provide a more robust and scalable approach. This approach provides the following advantages: 1) integration of the first optical components, including lenses, mirrors polarizers, beamsplitters, etc., into a pick and place object, 2) built-in self-alignment of interconnects, and 3) scalable to mass production. As an example, for the PIC to MCF connections, such as might be included as part of the printed keyed fiber receptacles 208 and 210, a BNC-like interface can be positioned between components. Analogous microscale single mode and multimode interconnects have been fabricated using this approach as shown in FIGS. 35 and 36, and single mode waveguide cores can be isolated in protective housings as has been demonstrated as shown in FIG. 37. This provides mechanical stabilization to delicate cores with no design limitation and that can be backfilled with low index cladding.

Figure 38:
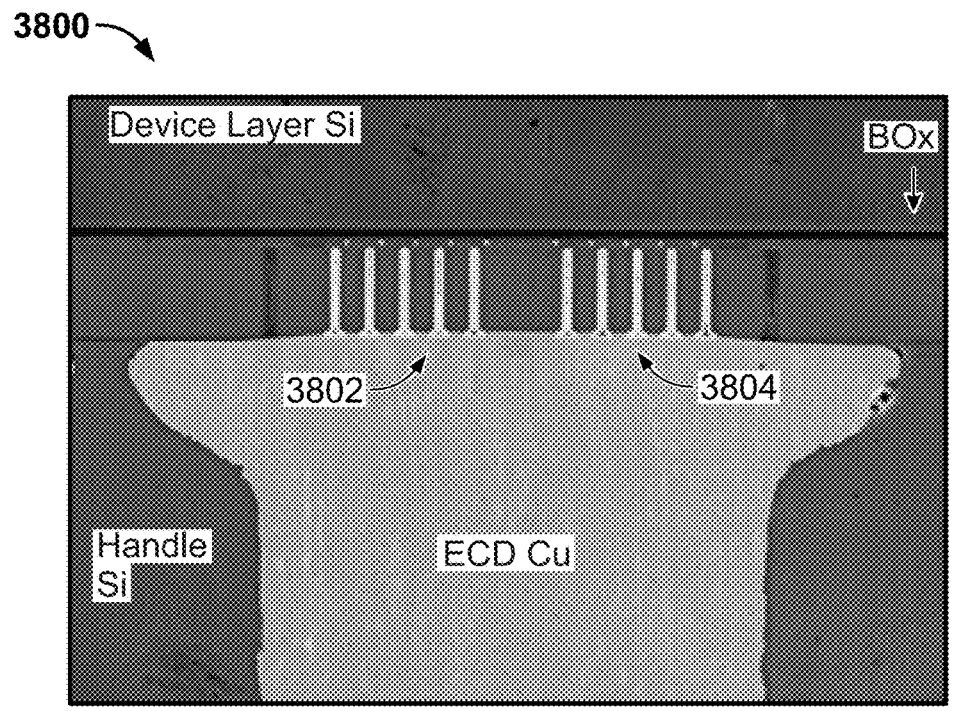
FIG. 38 is an image of a copper plated through silicon via.

The simultaneous desired improvements in areal bandwidth density, aggregate bandwidth, and power consumption drive the design of the dense integration of the VCSEL chip 104, the PIC chip 108, and the PD chip 106 directly with the control/logic chip 102. The chips 104, 106, and 108 are flip-chip bonded to the control/logic chip 102 by way of lead-free solder bumps. Electrical connection to the PIC chip 108 is made to the back (non-device) side of the thinned chip utilizing copper-plated TSVs. An image 3800 of exemplary copper-plated TSVs 3802 and exemplary copper-plated TSVs 3804 (where each of TSVs 3802 and TSVs 3804 include 5 TSVs) is shown in FIG. 38. Electrical connection to the VCSEL and PD chips 104 and 106 can be made on the top (epitaxially grown) side, as the VCSELs and PDs are designed to be bottom-emitting and receiving, respectively.

Figure 39:
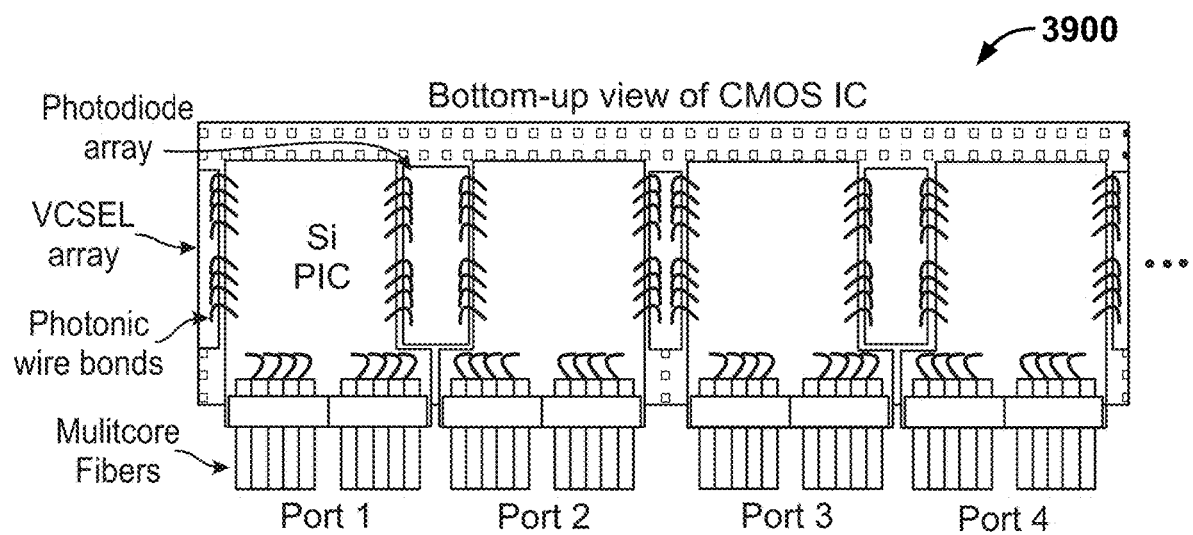
FIG. 39 is a bottom-up view of an exemplary photonics transceiver in accordance with one or more embodiments of the present invention.

A series of 3D printing steps can then be used to write the set of micro-optics and attach the bulk-produced fiber receptacles before mounting the assembled MCM onto a populated PCB for testing. Finally, the MCFs are inserted for testing. A schematic depicting scaling multiple adjacent photonic I/O blocks and optical ports, thereby creating a transceiver 3900, is illustrated in FIG. 39. The transceiver 3900 illustrated in FIG. 39 would have four times the bandwidth of the transceiver 100 illustrated in FIGS. 1 and 2.

Figure 40:
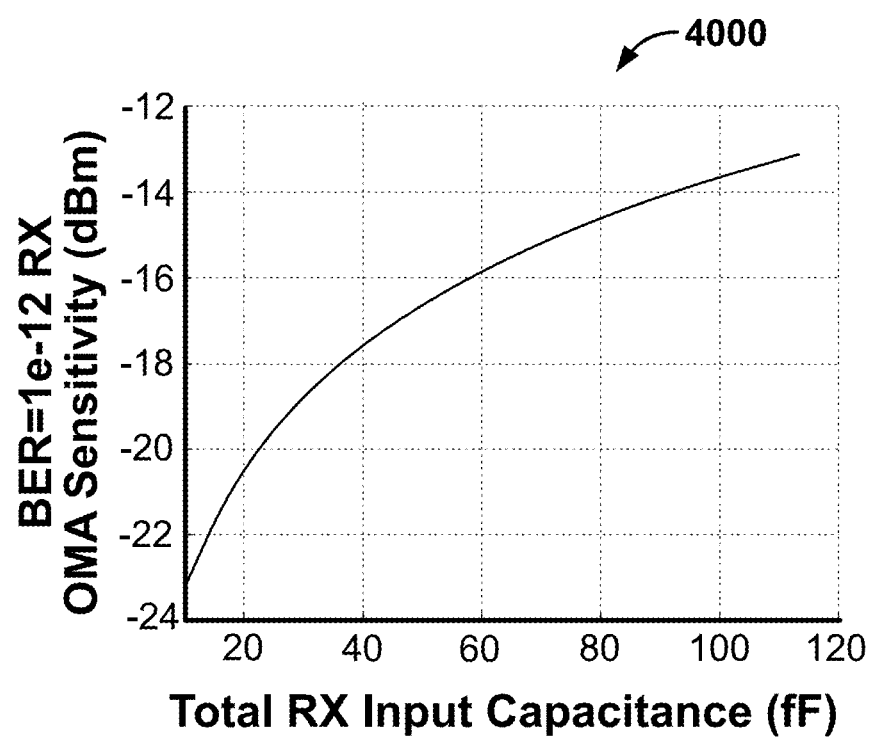
FIG. 40 is a plot that depicts the sensitivity of the receive architecture of the exemplary photonics transceiver in accordance with one or more embodiments of the present invention.

Information pertaining to a proposed power budget is now set forth. Both the optical power budget and energy consumption of the photonic transceiver 100 is described. One component that determines the overall link energy efficiency is the receiver sensitivity. FIG. 40 is a plot 4000 that depicts simulation results that exhibit improvements in BER=$10^{-12}$ sensitivity as a function of total receiver input capacitance. Optical modulation amplitude (OMA) sensitivity to near −20.5 dBm is possible due to the combination of: 1) high-density flip chip bonding of the TIA input stage for 20 fF of total input capacitance, and 2) the subsequent low-voltage inverter-based CTLE. This excellent receiver sensitivity allows for operation of the source VCSEL at a 125 µW optical output power level with a 10 dB link budget with a 2 dB margin.

While the above provided a description of a transceiver, the functionality of the transceiver may be split into two modules in other embodiments. For example, one embodiment includes the transmit functionality, and thus would include a CMOS control/logic chip; a VCSEL chip that is, for example, flip-chip bonded to an underside of the control/logic chip; and a PIC that is, for example, flip-chip bonded to the underside of the control/logic chip and is further optically coupled to the VCSELs in the VCSEL chip. As another example, one embodiment includes the receive functionality, and thus would include a CMOS control/logic chip; a PD chip that is, for example, flip-chip bonded to an underside of the control/logic chip; and a PIC that is, for example, flip-chip bonded to the underside of the control/logic chip and is further optically coupled to the PDs in the PD chip.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A photonics transceiver comprising:
   a first chip that includes a plurality of light sources, each of the plurality of light sources adapted to continuously emit a corresponding wavelength of light, each of the plurality of light sources includes a corresponding vertical cavity surface emitting laser (VCSEL), the plurality of VCSELs formed on a non-planar substrate, the non-planar substrate including a ridge, the ridge including a tapered width;
   a second chip that includes a plurality of photodetectors, each of the plurality of photodetectors adapted to produce a corresponding signal indicative of a received magnitude of light;
   a third chip that includes:
      Tx componentry including a wavelength division multiplexer, the wavelength division multiplexer including a first plurality of tunable ring resonators, and each of the first plurality of tunable ring resonators being optically coupled to a respective one of the plurality of light sources; and
      Rx componentry including a wavelength division demultiplexer, the wavelength division demultiplexer including a second plurality of tunable ring resonators, and each of the second plurality of tunable ring resonators being optically coupled to a respective one of the plurality of photodetectors; and
   a fourth chip that comprises control/logic circuitry that is electrically coupled to the first chip, the second chip, and the third chip.

2. The photonics transceiver of claim 1,
   wherein each of the plurality of light sources is adapted to emit light at a different wavelength from each remaining one of the plurality of light sources; and
   wherein a wavelength spacing between the different wavelengths of light is approximately 1 nm.

3. The photonics transceiver of claim 1,
wherein the plurality of light sources is optically coupled to the Tx componentry by a first set of micro-optics; and
wherein the plurality of photodetectors is optically coupled to the Rx componentry by a second set of micro-optics.

4. The photonics transceiver of claim 1,
wherein the Tx componentry of the third chip includes a plurality of modulators, each of the plurality of modulators optically coupled to a respective one of the plurality of light sources;
wherein each of the plurality of modulators is electrically coupled to the circuitry of the fourth chip; and
wherein the control/logic circuitry is adapted to control the plurality of modulators to modulate light received from the plurality of light sources to encode data that is to be transmitted by the optical transceiver on the light.

5. The photonics transceiver of claim 4, wherein each of the plurality of modulators includes a transparent conducting oxide integrated optical modulator.

6. The photonics transceiver of claim 1,
wherein the Tx componentry of the third chip includes a plurality of monitor photodetectors;
wherein each of the plurality of monitor photodetectors is optically coupled to a corresponding one of the plurality of light sources; and
wherein each of the plurality of monitor photodetectors is adapted to produce a corresponding signal indicative of a received magnitude of light.

7. The photonics transceiver of claim 1,
wherein the third chip includes a first fiber receptacle optically coupled to the Tx componentry; and
wherein the third chip includes a second fiber receptacle optically coupled to the Rx componentry.

8. The photonics transceiver of claim 7,
wherein the first fiber receptacle is optically coupled to the Tx componentry by a first set of micro-optics; and
wherein the second fiber receptacle is optically coupled to the Rx componentry by a second set of micro-optics.

9. The photonics transceiver of claim 1, wherein the first chip is flip-chip bonded to the fourth chip, the second chip is flip-chip bonded to the fourth chip, and the third chip is flip-chip bonded to the fourth chip.

10. The photonics transceiver of claim 9, wherein the third chip is bonded to the fourth chip via a plurality of through silicon vias.

11. The photonics transceiver of claim 1, wherein the photonics transceiver is adapted to consume less than 500 fJ/bit.

12. The photonics transceiver of claim 1 comprising at least eight transmit channels and at least eight receive channels.

13. The photonics transceiver of claim 1, wherein the photonics transceiver is adapted to have an areal bandwidth density of at least 5 Tbps/mm$^2$ when transmitting data and is adapted to have an areal bandwidth density of at least 5 Tbps/mm$^2$ when receiving data.

14. A photonics transceiver comprising:
a first chip that includes a plurality of light sources, each of the plurality of light sources adapted to continuously emit a corresponding wavelength of light, each of the plurality of light sources includes a corresponding vertical cavity surface emitting laser (VCSEL), each of the plurality of VCSELs includes:
a gain region adapted to provide optical gain;
a distributed Bragg reflector adapted to reflect a corresponding wavelength of light; and
a buffer layer located between the gain region and the distributed Bragg reflector, a thickness of the buffer layer differing in a step-wise manner relative to a corresponding thickness of a corresponding buffer layer in each adjacent one of the plurality of VCSELs;
a second chip that includes a plurality of photodetectors, each of the plurality of photodetectors adapted to produce a corresponding signal indicative of a received magnitude of light;
a third chip that includes:
Tx componentry including a wavelength division multiplexer, the wavelength division multiplexer including a first plurality of tunable ring resonators, and each of the first plurality of tunable ring resonators being optically coupled to a respective one of the plurality of light sources; and
Rx componentry including a wavelength division demultiplexer, the wavelength division demultiplexer including a second plurality of tunable ring resonators, and each of the second plurality of tunable ring resonators being optically coupled to a respective one of the plurality of photodetectors; and
a fourth chip that comprises control/logic circuitry that is electrically coupled to the first chip, the second chip, and the third chip.

15. A photonics transceiver comprising:
a first chip that includes a plurality of light sources, each of the plurality of light sources adapted to continuously emit a corresponding wavelength of light;
a second chip that includes a plurality of photodetectors, each of the plurality of photodetectors adapted to produce a corresponding signal indicative of a received magnitude of light;
a third chip that includes:
Tx componentry including a wavelength division multiplexer, the wavelength division multiplexer including a first plurality of tunable ring resonators, and each of the first plurality of tunable ring resonators being optically coupled to a respective one of the plurality of light sources; and
Rx componentry including a wavelength division demultiplexer, the wavelength division demultiplexer including a second plurality of tunable ring resonators, and each of the second plurality of tunable ring resonators being optically coupled to a respective one of the plurality of photodetectors;
wherein each of the first plurality of tunable optical ring resonators and each of the second plurality of tunable optical ring resonators comprises:
a resonator ring adapted to have a minimum free spectral range of 1 nm;
a tuner ring that is positioned directly above the resonator ring, the tuner ring adapted to have a minimum free spectral range of 1 nm, the tuner ring adapted to move in a direction normal to a plane of the resonator ring;
a top electrode that is mechanically coupled to the tuner ring;
a bottom electrode that is mechanically coupled to the resonator ring; and
one or more springs each of which are mechanically and electrically coupled to the top electrode;
wherein a respective resonant wavelength of a respective resonator ring is tunable by applying a respective voltage between a respective top electrode and a respective bottom electrode; and a fourth chip that comprises control/logic circuitry that is electrically coupled to the first chip, the second chip, and the third chip.

16. The photonics transceiver of claim 15, wherein each of the one or more springs is one of an external folded spring, an external linear segment spring, an external multi-linear segment spring, an external cantilever spring, an internal folded spring, an internal linear segment spring, an internal multi-linear segment spring, or an internal cantilever spring.

17. The photonics transceiver of claim 16, wherein each of the one or more springs is one of an internal folded spring, an internal linear segment spring, an internal multi-linear segment spring, or an internal cantilever spring.

18. The photonics transceiver of claim 15,
wherein each resonator ring includes one of Si, $Si_3N_4$, $Al_2O_3$, $LiNbO_3$, or $Ta_2O_5$; and
wherein each tuner ring includes $SiO_2$ or $Si_3N_4$.

19. The photonics transceiver of claim 15,
wherein the Tx componentry of the third chip includes a plurality of modulators, each of the plurality of modulators optically coupled to a respective one of the plurality of light sources;
wherein each of the plurality of modulators is electrically coupled to the circuitry of the fourth chip; and
wherein the control/logic circuitry is adapted to control the plurality of modulators to modulate light received from the plurality of light sources to encode data that is to be transmitted by the optical transceiver on the light.

20. The photonics transceiver of claim 15,
wherein the Tx componentry of the third chip includes a plurality of monitor photodetectors;
wherein each of the plurality of monitor photodetectors is optically coupled to a corresponding one of the plurality of light sources; and
wherein each of the plurality of monitor photodetectors is adapted to produce a corresponding signal indicative of a received magnitude of light.

* * * * *